US009209319B2

(12) United States Patent
Takano

(10) Patent No.: US 9,209,319 B2
(45) Date of Patent: Dec. 8, 2015

(54) SENSOR DEVICE MANUFACTURING METHOD AND SENSOR DEVICE

(71) Applicant: Dai Nippon Printing Co., Ltd., Tokyo (JP)

(72) Inventor: Takamasa Takano, Tokyo (JP)

(73) Assignee: DAI NIPPON PRINTING CO., LTD, Tokyo (JP)

( * ) Notice: Subject to any disclaimer, the term of this patent is extended or adjusted under 35 U.S.C. 154(b) by 40 days.

(21) Appl. No.: 13/729,311

(22) Filed: Dec. 28, 2012

(65) Prior Publication Data

US 2013/0113055 A1 May 9, 2013

Related U.S. Application Data

(63) Continuation of application No. PCT/JP2011/064313, filed on Jun. 22, 2011.

(30) Foreign Application Priority Data

Jun. 30, 2010 (JP) ................................ 2010-150109

(51) Int. Cl.
*H01L 29/84* (2006.01)
*H01L 23/31* (2006.01)
(Continued)

(52) U.S. Cl.
CPC ............... *H01L 29/84* (2013.01); *B81B 7/007* (2013.01); *B81B 7/0025* (2013.01); *B81B 7/0054* (2013.01); *G01P 15/0802* (2013.01); *G01P 15/123* (2013.01); *H01L 21/02* (2013.01);
(Continued)

(58) Field of Classification Search
USPC ..................................... 257/415; 438/51, 617
See application file for complete search history.

(56) References Cited

U.S. PATENT DOCUMENTS 4,733,289 A * 3/1988 Tsurumaru ................... 257/640
5,207,102 A * 5/1993 Takahashi et al. .............. 73/727
(Continued)

FOREIGN PATENT DOCUMENTS

JP 60-160627 A 8/1985
JP 62-144368 A 6/1987
(Continued)

OTHER PUBLICATIONS

International Search Report for PCT/JP2011/064313 dated Sep. 27, 2011.
(Continued)

*Primary Examiner* — Earl Taylor
(74) *Attorney, Agent, or Firm* — Pearne & Gordon LLP

(57) ABSTRACT

A method for manufacturing a sensor device is provided. The method prevents corrosion of metal electrodes of a sensor due to outside air with high humidity and preventing the occurrence of warpage of the sensor due to resin sealing of the sensor, thereby reducing the influence on sensor characteristics, and provides the sensor device. The method includes arranging a sensor on a substrate, the sensor having a fixed part, a movable part positioned inside the fixed part, a flexible part connecting the fixed part and the movable part, and a plurality of metal electrodes, electrically connecting the plurality of metal electrodes of the sensor and a plurality of terminals of the substrate with bonding wires, and covering portions of the plurality of metal electrodes of the sensor connected to the bonding wires with a resin so that a part of the bonding wires between the plurality of metal electrodes and the plurality of terminals is exposed.

14 Claims, 16 Drawing Sheets

(51) Int. Cl.
*H01L 23/49* (2006.01)
*H01L 21/447* (2006.01)
*G01P 15/08* (2006.01)
*G01P 15/12* (2006.01)
*H01L 23/00* (2006.01)
*H01L 21/02* (2006.01)
*B81B 7/00* (2006.01)

(52) U.S. Cl.
CPC .............. *H01L24/48* (2013.01); *H01L 24/49* (2013.01); *H01L 24/85* (2013.01); *B81B 2201/0235* (2013.01); *B81B 2207/096* (2013.01); *B81B 2207/115* (2013.01); *G01P 2015/0842* (2013.01); *H01L 2224/04042* (2013.01); *H01L 2224/48091* (2013.01); *H01L 2224/48465* (2013.01); *H01L 2224/48472* (2013.01); *H01L 2224/48992* (2013.01); *H01L 2224/48997* (2013.01); *H01L 2224/49113* (2013.01); *H01L 2224/49171* (2013.01); *H01L 2224/8592* (2013.01); *H01L 2224/92247* (2013.01); *H01L 2924/01004* (2013.01); *H01L 2924/01005* (2013.01); *H01L 2924/0106* (2013.01); *H01L 2924/01006* (2013.01); *H01L 2924/01013* (2013.01); *H01L 2924/01029* (2013.01); *H01L 2924/01033* (2013.01); *H01L 2924/01045* (2013.01); *H01L 2924/01047* (2013.01); *H01L 2924/01079* (2013.01); *H01L 2924/14* (2013.01); *H01L 2924/1461* (2013.01); *H01L 2924/3511* (2013.01)

(56) References Cited

U.S. PATENT DOCUMENTS

| | | | | |
|---|---|---|---|---|
| 5,209,120 A * | 5/1993 | Araki | ............................ | 73/727 |
| 5,333,505 A * | 8/1994 | Takahashi et al. | .............. | 73/727 |
| 5,434,105 A * | 7/1995 | Liou | ............................. | 29/827 |
| 5,436,491 A * | 7/1995 | Hase et al. | ..................... | 257/417 |
| 5,581,119 A * | 12/1996 | Liou | ........................... | 257/676 |
| 6,093,576 A * | 7/2000 | Otani | ................ | 438/5 |
| 6,401,545 B1 * | 6/2002 | Monk et al. | ..................... | 73/756 |
| 6,751,858 B2 * | 6/2004 | Tokuhara et al. | ................ | 29/841 |
| 6,769,319 B2 * | 8/2004 | McDonald et al. | ............ | 73/866.1 |
| 7,396,701 B2 * | 7/2008 | Shigemura et al. | ............ | 438/108 |
| 7,401,521 B2 * | 7/2008 | Bellini et al. | ..................... | 73/706 |
| 7,568,390 B2 * | 8/2009 | Shizuno | .......................... | 73/493 |
| 7,985,628 B2 * | 7/2011 | Kuan et al. | ..................... | 438/124 |
| 8,557,633 B2 * | 10/2013 | Shigemura et al. | ............ | 438/108 |
| 2002/0050052 A1 * | 5/2002 | Tokuhara et al. | ................ | 29/595 |
| 2005/0279166 A1 * | 12/2005 | Shizuno | .......................... | 73/493 |
| 2006/0110859 A1 * | 5/2006 | Shigemura et al. | ............ | 438/125 |
| 2006/0137461 A1 * | 6/2006 | Bellini et al. | ..................... | 73/754 |
| 2008/0088037 A1 * | 4/2008 | Byun et al. | ..................... | 257/784 |
| 2009/0152706 A1 * | 6/2009 | Kuan et al. | ..................... | 257/690 |
| 2009/0255340 A1 * | 10/2009 | Shizuno | ......................... | 73/514.33 |
| 2011/0183474 A1 * | 7/2011 | Shigemura et al. | ............ | 438/127 |
| 2013/0113055 A1 * | 5/2013 | Takano | ......................... | 257/415 |

FOREIGN PATENT DOCUMENTS

| | | |
|---|---|---|
| JP | 03-112170 A | 5/1991 |
| JP | 08-320340 A | 12/1996 |
| JP | 2002-090245 A | 3/2002 |
| JP | 2002-098709 A | 4/2002 |
| JP | 2003-156507 A | 5/2003 |
| JP | 2006-145410 A | 6/2006 |

OTHER PUBLICATIONS

Office Action issued in Japanese Patent Application No. 2012-086208 dated Feb. 25, 2014.

Decision for Refusal issued in Japanese Patent Application No. 2012-086208 dated Nov. 11, 2014.

* cited by examiner

Fig.1
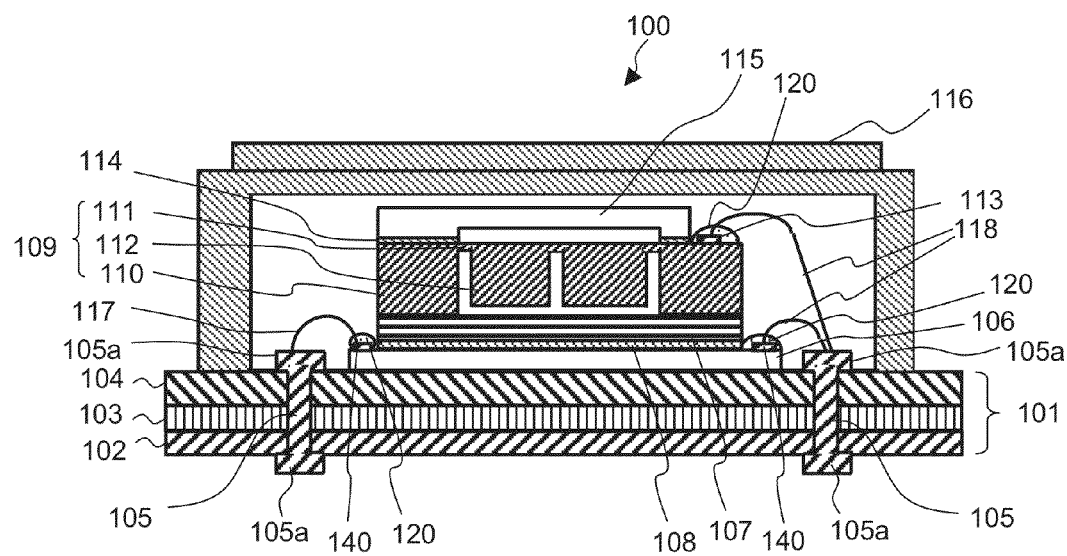
(A)
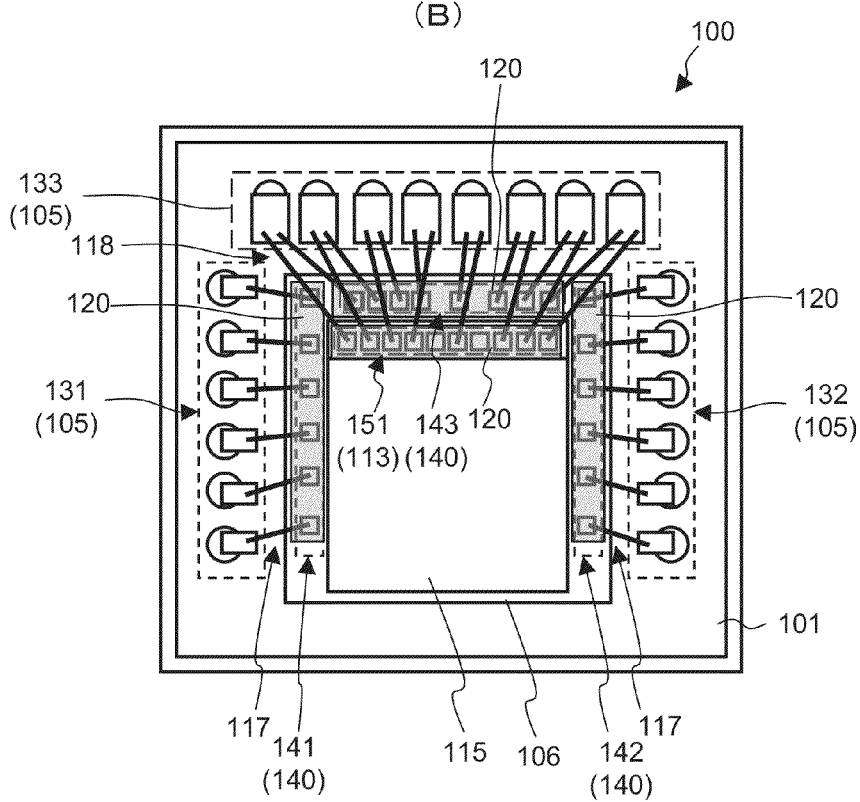
(B)

Fig.2
(A) 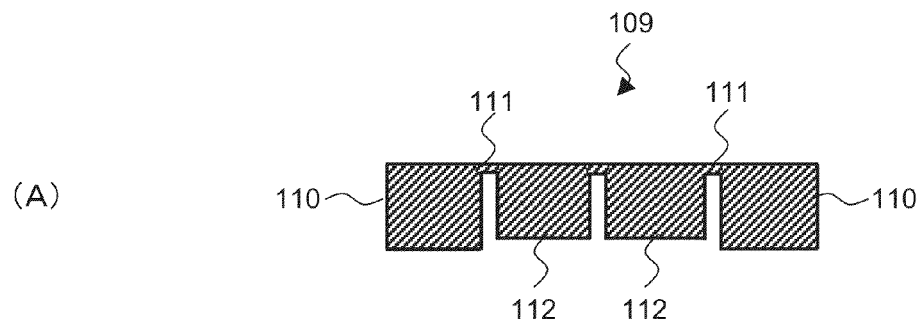
(B) 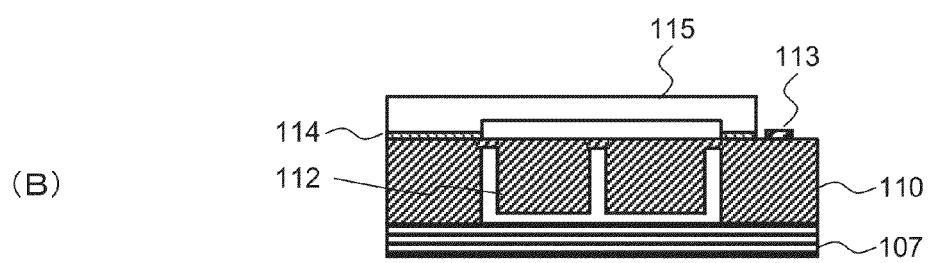
(C) 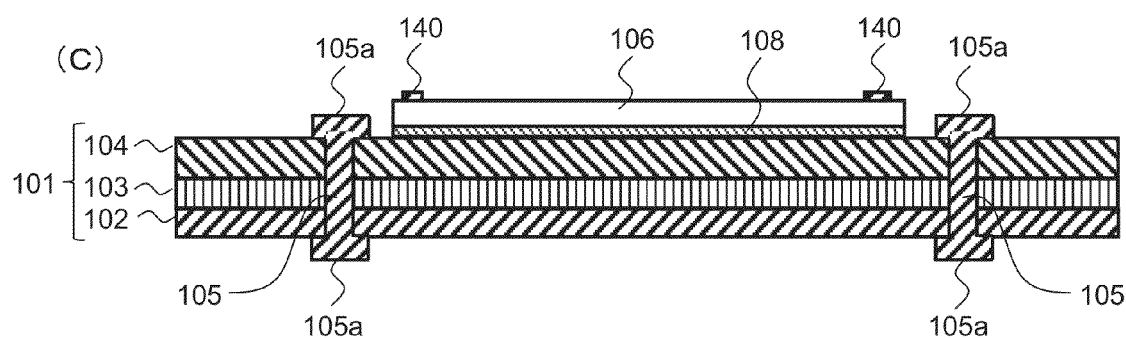

Fig.10
(A)
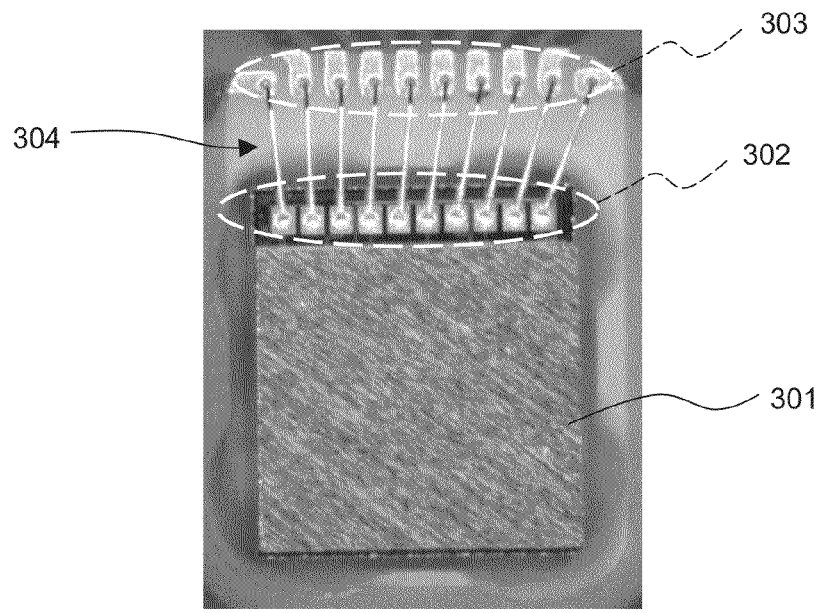
(B)
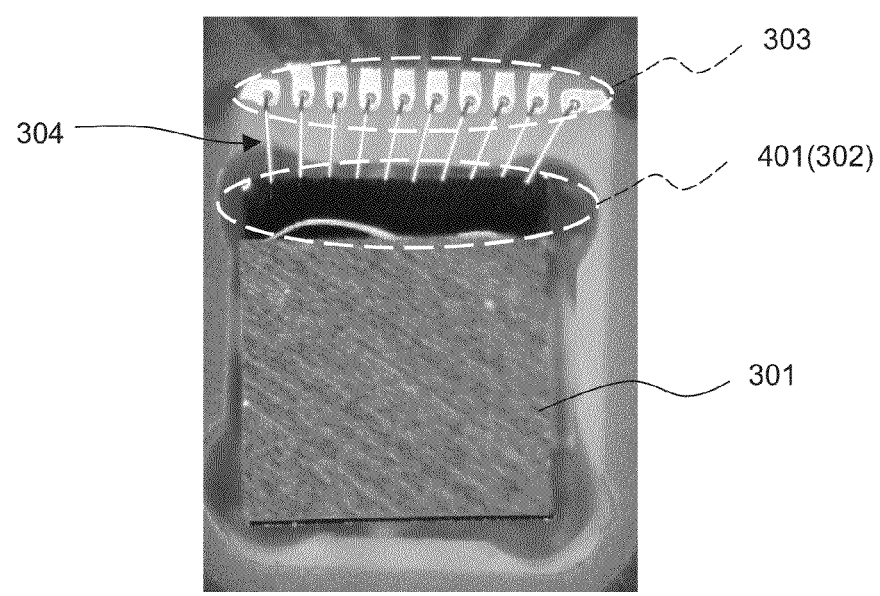

Fig.15
(A)
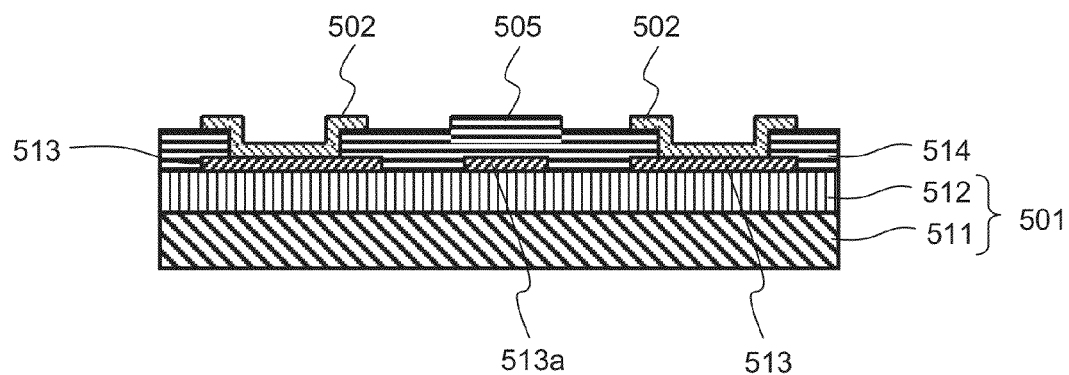
(B)
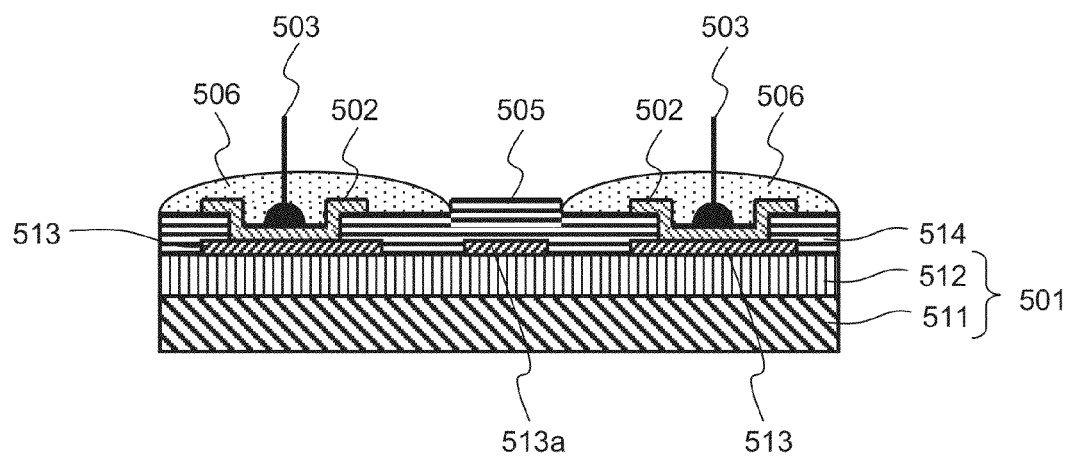

Fig.16
(A)
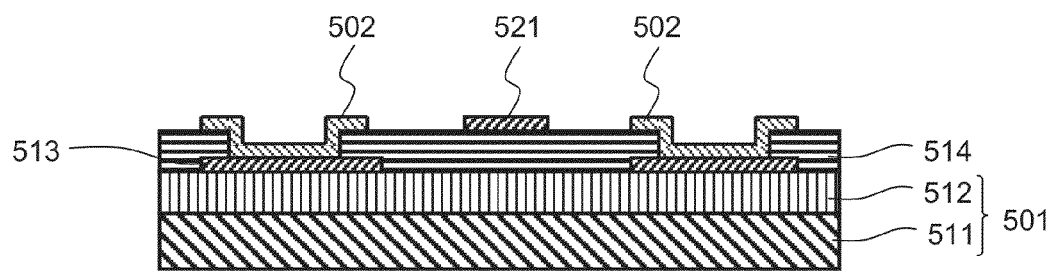
(B)
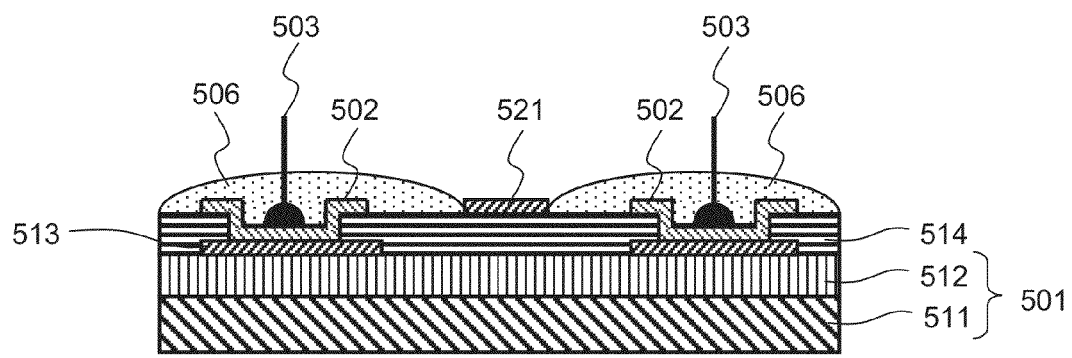

SENSOR DEVICE MANUFACTURING METHOD AND SENSOR DEVICE

CROSS REFERENCE TO RELATED APPLICATION

This application is based upon and claims the benefit of priority from Japanese Patent Application No. 2010-150109 filed on Jun. 30, 2010 and the prior PCT Application PCT/JP2011/064313 filed on Jun. 22, 2011, the entire contents of which are incorporated herein by reference.

FIELD

The present invention relates to a method of manufacturing a sensor device having a movable unit movable by an external force, and to the sensor device.

BACKGROUND

In recent years, the weight and size of various types of electronic equipment have been decreased, and the equipment has become multifunctional and high-functional. Thus, high density of electronic components to be mounted has been demanded. In response to this demand, various electronic components manufactured as semiconductor devices are increased. Other than circuit elements manufactured as semiconductor devices, various sensors have also been manufactured as semiconductor devices, and their weight and size have been decreased. For example, a mechanical quantity sensor device having a small and simple structure has been brought into practical use by using MEMS (Micro Electro Mechanical Systems) technology. As the mechanical quantity sensor device, for example, an acceleration sensor and an angular velocity sensor are known. In the acceleration sensor and the angular sensor, a sensor having a movable part that is displaced according to an external force is formed by using a semiconductor substrate, and a displacement of the movable part is detected as a change of an electrical signal indicating an acceleration or an angular velocity.

In the mechanical quantity sensor device as described above, to stably displace the movable part of the sensor, a hollow package is used to cover the semiconductor substrate having the sensor formed thereon with a package cap and seal a circumferential part of the package cap with resin or the like. In the mechanical quantity sensor device using this hollow package, when the circumferential part of the package cap is sealed with resin, the resin may infiltrate inside the package cap to flow to the sensor due to osmotic pressure, which disadvantageously degrades the working of the sensor and adversely affects sensor's sensitivity characteristics, frequency characteristics, and others. In a semiconductor acceleration sensor described in Japanese Patent Laid-open No. 2003-156507, coating with a resin for sealing the circumferential part of the package cap is performed twice to prevent the resin from infiltrating the inside a cap member.

In the mechanical quantity sensor device using the hollow package, there is another problem in which upon reception of stress from a package cap having a coefficient of thermal expansion different from that of the semiconductor substrate, sensor characteristics such as the offset voltage and sensitivity of the sensor cannot be made highly accurate. In a semiconductor acceleration sensor described in Japanese Patent Laid-open No. 2002-98709, a plurality of supports are provided between the package cap and the mount substrate, and a gap between the package cap and pads of the mount substrate is filled with a die bond paste (an adhesive) to mitigate distortion occurring to the sensor due to a difference in coefficient of thermal expansion.

In the mechanical quantity sensor device using the hollow structure package described above, the circumferential part of the package cap is sealed with resin to block the inside of the hollow package from outside air. However, outside air gradually infiltrates the inside of the hollow package due to changes over the years, and air inside the hollow package becomes the same as outside air. Also, in the mechanical quantity sensor device using the hollow package, terminals on a substrate on which the sensor is mounted and the electrode pads on a sensor are connected with bonding wires. For the electrode pads on the sensor, a metal material with high humidity resistance such as Au cannot be used in view of cost, and Al or an Al alloy is used. When the mechanical quantity sensor device is used in a place with high humidity, the inside of the hollow package is also in a highly humid state, and therefore there is a possibility that the electrode pads on the sensor for connection of the bonding wires may corrode. This corrosion may break wirings.

In Japanese Patent Laid-open No. 2003-156507 and Japanese Patent Laid-open No. 2002-98709, coating with the resin and the die bond paste (the adhesive) is performed so as to cover a portion including the electrode pads on the sensor, the electrode pads on the mount substrate, and the bonding wires connecting these electrode pads. For this reason, the offset voltage of the sensor is increased due to the influence of stress caused because of the difference in coefficient of thermal expansion of between the resin and the die bond paste present around the sensor and the semiconductor substrate.

The present invention is made in view of the problems described above, and has an object of providing a sensor device manufacturing method and the sensor device achieving both of protection of a metal electrode of the sensor in a hollow package against humidity and minimization of influences on sensor characteristics.

SUMMARY

A method for manufacturing a sensor device according to an embodiment of the present invention includes: arranging a sensor on a substrate, the sensor having a fixed part, a movable part positioned inside the fixed part, a flexible part connecting the fixed part and the movable part, and a plurality of metal electrodes; electrically connecting the plurality of metal electrodes of the sensor and a plurality of terminals of the substrate with bonding wires; and covering portions of the plurality of metal electrodes of the sensor connected to the bonding wires with a resin so that a part of the bonding wires between the plurality of metal electrodes and the plurality of terminals is exposed. According to this manufacturing method, since the plurality of metal electrodes of the sensor are covered with the resin, it is possible to prevent corrosion of the metal electrodes due to outside air with high humidity and to prevent the occurrence of warpage of the sensor due to the resin, thereby reducing the influence on sensor characteristics and improving reliability of the sensor device.

Also, the method for manufacturing the sensor device according to an embodiment of the present invention may further include: arranging a control IC having a plurality of metal electrodes between the substrate and the sensor; electrically connecting the plurality of metal electrodes of the control IC and the plurality of metal electrodes of the sensor and the plurality of terminals of the substrate with the bonding wires; and covering portions of the plurality of metal electrodes of the control IC connected to the bonding wires with the resin so that a part of the bonding wires between the plurality of metal electrodes of the control IC and the plurality of terminals is exposed. According to this manufacturing method manufacturing method, since the plurality of metal electrodes of the control IC are covered with the resin, it is possible to prevent corrosion of the metal electrodes due to outside air with high humidity and to prevent the occurrence of warpage of the sensor due to the resin, thereby reducing the influence on sensor characteristics and improving reliability of the sensor device.

Also, in the method for manufacturing the sensor device according to an embodiment of the present invention, the portions where the plurality of metal electrodes of the sensor and the bonding wires are connected may be individually covered with the resin. According to this manufacturing method, since the plurality of metal electrodes of the sensor are individually covered with the resin, stress given from the resin to the sensor can be further reduced, and the occurrence of warpage of the sensor due to the resin can be prevented, thereby reducing the influence on sensor characteristics and improving reliability of the sensor device.

Furthermore, in the method for manufacturing the sensor device according to an embodiment of the present invention, the portions where the plurality of metal electrodes of the control IC and the bonding wires are connected may be individually covered with the resin. According to this manufacturing method, since the plurality of metal electrodes of the control IC are individually covered with the resin, stress given from the resin to the sensor can be further reduced, and the occurrence of warpage of the sensor due to the resin can be prevented, thereby reducing the influence on sensor characteristics and improving reliability of the sensor device.

Still further, the method for manufacturing the sensor device according to an embodiment of the present invention may further include forming, between the plurality of metal electrodes of the sensor or between the plurality of metal electrodes of the control IC, an isolating part isolating the resin for each of the metal electrodes. According to manufacturing method, since the resin covering the plurality of metal electrodes of the sensor or the control IC is isolated by the isolating part, the resin covering each of the metal electrodes can be prevented from spreading over the electrode pads, thereby preventing the occurrence of warpage of the sensor due to the resin.

Still further, in the method for manufacturing the sensor device according to an embodiment of the present invention, a silicon resin material having a flexural modulus of elasticity equal to or smaller than 5 GPa may be used as the resin. According to this manufacturing method, stress given from the resin to the sensor can be reduced.

A sensor device according to an embodiment of the present invention includes: a sensor having a fixed part, a movable part positioned inside the fixed part, a flexible part connecting the fixed part and the movable part, and a plurality of metal electrodes; a substrate having a plurality of terminals and having the sensor mounted thereon; and bonding wires electrically connecting the plurality of metal electrodes and the plurality of terminals of the substrate, wherein portions where the plurality of metal electrodes and the bonding wires are connected being covered with a resin, and a part of the bonding wires between the plurality of metal electrodes and the plurality of terminals being exposed. According to this sensor device, since the plurality of metal electrodes of the sensor are covered with the resin, it is possible to prevent corrosion of the metal electrodes due to outside air with high humidity and to prevent the occurrence of warpage of the sensor due to the resin, thereby reducing the influence on sensor characteristics and improving reliability of the sensor device.

Also, the sensor device according to an embodiment of the present invention may further include a control IC arranged between the substrate and the sensor and having a plurality of metal electrodes, wherein the bonding wires electrically connects the plurality of metal electrodes of the control IC and the plurality of terminals of the substrate, portions where the plurality of metal electrodes of the control IC and the bonding wires are connected may be covered with the resin, and a part of the bonding wires between the plurality of metal electrodes of the control IC and the plurality of terminals may be exposed. According to this sensor device, since the plurality of metal electrodes of the control IC are covered with the resin, it is possible to prevent corrosion of the metal electrodes due to outside air with high humidity and to prevent the occurrence of warpage of the sensor due to the resin, thereby reducing the influence on sensor characteristics and improving reliability of the sensor device.

Furthermore, in the sensor device according to an embodiment of the present invention, the sensor may have a plurality of isolating parts that isolate the resin between the plurality of metal electrodes, and the portions where the plurality of metal electrodes of the sensor and the bonding wires are connected may be individually covered with the resin. According to this sensor device, since the plurality of metal electrodes of the sensor are individually covered with the resin, stress given from the resin to the sensor can be further reduced, and the occurrence of warpage of the sensor due to the resin can be prevented, thereby reducing the influence on sensor characteristics and improving reliability of the sensor device.

Still further, in the sensor device according to an embodiment of the present invention, the control IC may have a plurality of isolating parts that isolate the resin between the plurality of metal electrodes, and the portions where the plurality of metal electrodes of the control IC and the bonding wires are connected may be individually covered with the resin. According to this sensor device, since the plurality of metal electrodes of the control IC are individually covered with the resin, stress given from the resin to the sensor can be further reduced, and the occurrence of warpage of the sensor due to the resin can be prevented, thereby improving reliability of the sensor device.

Still further, in the sensor device according to an embodiment of the present invention, the resin may be a silicon resin material having a flexural modulus of elasticity equal to or smaller than 5 GPa. According to this sensor device, since the resin has a low water absorption and the resin material has a flexural modulus of elasticity equal to or smaller than 5 GPa, oxidation of the electrode pads due to outside air with high humidity can be prevented, and the occurrence of warpage of the sensor due to the resin can be prevented.

According to the present invention, by covering each of the metal electrodes of the sensor with the resin, it is possible to provide a sensor device manufacturing method and sensor device preventing corrosion of the metal electrodes due to outside air with high humidity and preventing the occurrence of warpage of the sensor due to the resin, thereby reducing the influence on sensor characteristics.

BRIEF DESCRIPTION OF DRAWINGS

FIG. 1 shows views of an entire structure of an acceleration sensor according to a first embodiment of the present invention, FIG. 1(A) shows a sectional view of the entire structure of the acceleration sensor and FIG. 1(B) shows a plan view of the entire structure of the acceleration sensor;

FIG. 2 shows sectional views for describing a part of an acceleration sensor manufacturing method of FIG. 1, FIG. 2(A) shows a sectional view for describing a process of forming a sensor with a semiconductor substrate, FIG. 2(B) shows a sectional view for describing a process of bonding a sensor upper cap and a sensor lower cap to the sensor of FIG. 2(A), and FIG. 2(C) shows a sectional view for describing a substrate forming process and a control IC bonding process;

FIG. 3(A) shows a sectional view for describing the sensor bonding process of FIG. 2(B), a bonding wire connecting process, and a process of coating with a potting resin and FIG. 3(B) shows a sectional view for describing a package cap bonding process;

FIG. 8(A) shows a partial sectional view of the acceleration sensor for describing the state in which a region including through electrodes, bonding wires, and electrode pads are coated with a potting resin, FIG. 8(B) shows a partial sectional view of the acceleration sensor for describing a process of, from the state depicted in FIG. 8(A), connecting the through electrodes and the electrode pads of the sensor with the bonding wires, and FIG. 8(C) shows a partial sectional view of the acceleration sensor for describing the state in which the through electrodes and each electrode pads of the sensor are coated with a potting resin;

FIG. 10 shows plan views for describing a specific example of the sensor according to the first embodiment, FIG. 10(A) shows a plan view for describing an example of structure of the sensor and FIG. 10(B) shows a plan view of the state in which a plurality of electrode pads of the sensor are sealed with the potting resin;

FIG. 15 shows A-A line sectional views of FIG. 14 for describing an example of a method of manufacturing electrode pads and isolating parts according to a second embodiment, FIG. 15(A) shows an A-A line sectional view of FIG. 14 for describing a process of forming electrode pads and isolating parts and FIG. 15(B) shows an A-A line sectional view for describing a process of coating a potting resin;

FIG. 16 shows A-A line sectional views of FIG. 14 for describing another example of the method of manufacturing electrode pads and isolating parts according to the second embodiment, FIG. 16(A) shows an A-A line sectional view of FIG. 14 for describing a process of forming electrode pads and isolating parts and FIG. 16(B) shows an A-A line sectional view for describing a process of coating a potting resin.

DESCRIPTION OF EMBODIMENTS

Figure 3:
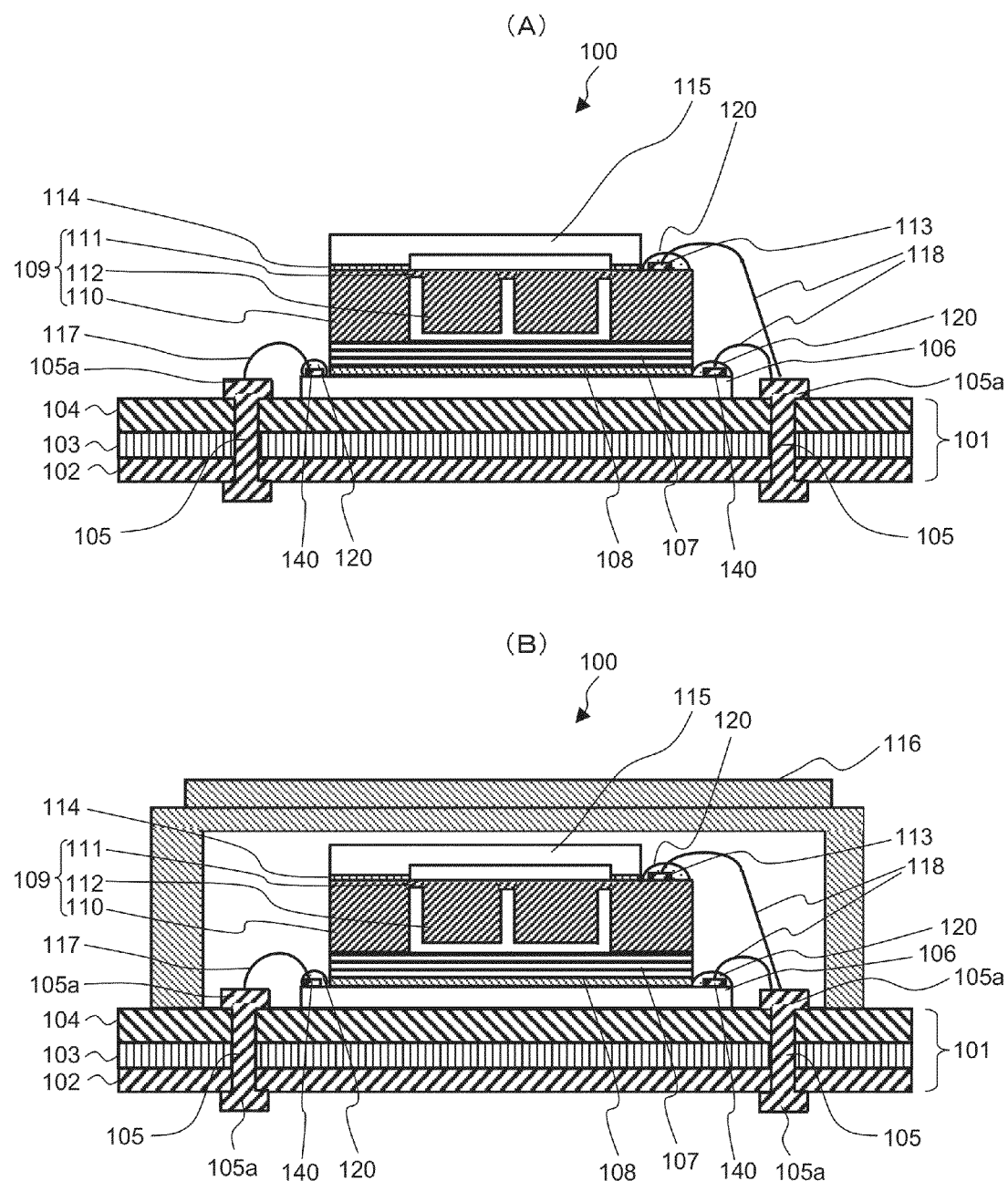
FIG. 3 shows sectional views for describing a part of the acceleration sensor manufacturing method of FIG. 1.

Embodiments of the present invention are described in detail below with reference to the drawings.

First Embodiment

In a first embodiment of the present invention, an example of an acceleration sensor as a sensor device is described with reference to FIG. 1 to FIG. 13.

[Structure of Acceleration Sensor]

First, the structure of an acceleration sensor according to the first embodiment of the present invention is described with reference to FIG. 1. FIG. 1 shows sectional views of an entire structure of an acceleration sensor 100 according to the first embodiment. While the case is described in the first embodiment in which a control IC is packaged together with the acceleration sensor, the present invention is not restricted to this, and only the sensor may be packaged.

FIG. 1(A) shows a sectional view of the entire structure of the acceleration sensor 100, and FIG. 1(B) shows a plan view of the entire structure of the acceleration sensor 100. In FIG. 1(A), the acceleration sensor 100 includes a substrate 101, through electrodes 105, a control IC 106, a sensor lower cap 107, a sensor 109, a sensor upper cap 115, a package cap 116, bonding wires 118, and others. FIG. 1(B) shows a plan view of the acceleration sensor 100 without the package cap 116 of the acceleration sensor 100 shown in FIG. 1(A) viewed from an upper surface side. In FIG. 1(B), electrode groups 131 to 133 each having a plurality of through electrodes 105 are arranged in left and right regions and an upper region of the substrate 101 in the drawing. Electrode groups 141 to 143 each having a plurality of electrode pads 140 are arranged in left and right regions and an upper region of the control IC 106 in the drawing. An electrode group 151 having a plurality of electrode pads 113 is arranged in an upper region of the sensor 109 in the drawing.

The substrate 101 is a printed circuit board of a three-layer structure having a wiring layer 102, an insulating layer 103, and a wiring layer 104. The insulating layer 103 contains an insulating material, and the wiring layers 102 and 104 contain a conductive material. The conductive material is a metal or the like and, for example, copper, silver, gold, nickel, palladium, or the like can be used. As the insulating material, an insulating resin is used. For example, an epoxy resin, a polyimide resin, a phenol resin, a silicon resin, polyester, polyacetal, polycarbonate, or the like can be used. The resin can be singly used, or two or more types of resin may be combined for use. Also, an inorganic filler such as glass, talc, or silica may be used together with the resin. While the example is described in the first embodiment in which the substrate 101 is formed of three layers, the present invention is not restricted to this, and the number of layers of the substrate 101 may be three or less or three or more.

The through electrodes 105 are formed so as to penetrate through the substrate 101 to be connected to the wiring layers 102 and 104. The control IC 106 is arranged at a predetermined position on an upper surface of the substrate 101 shown in the drawing. On the control IC 106, the plurality of electrode pads 140 (metal electrodes) for connection to the through electrodes 105 are formed.

The sensor 109 includes fixed part 110, flexible part 111 connected to the fixed part 110, weight part 112 connected to the flexible part 111, a plurality of piezoresistive elements (not shown) arranged on the flexible part 111 and detecting displacements of the flexible part 111 in XYZ three axis directions, and electrode pads 113 (metal electrodes). When an acceleration is applied to the sensor 109, the weight part 112 is displaced, and the flexible part 111 is bent according to this displacement. When the flexible part 111 is bent, a force is applied to the piezoresistive elements arranged on the flexible part 111, thereby changing a resistance value of the piezoresistive elements. This change of the resistance value is detected, thereby detecting the magnitude, direction, and others of the acceleration applied to the sensor 109. A signal from the sensor 109 passes from the electrode pads 113 through the bonding wires 118, the through electrodes 105, and others to be transmitted to the control IC 106. A signal from the control IC 106 passes through bonding wires 117, the through electrodes 105, and others to be transmitted to the outside of the substrate 101. The sensor 109 has a portion on a lower side in the drawing to which the sensor lower cap 107 is bonded.

The sensor upper cap 115 is formed so as to cover upper part of the flexible part 111 and the weight part 112 of the sensor 109, and is bonded to upper surface of the fixed part 110 of the sensor 109 with a resin 114 or the like. The sensor upper cap 115 limits an excessive displacement of the weight part 112 and the flexible part 111 in an upward direction, and prevents damage on the weight part 112 and the flexible part 111. The sensor upper cap 115 may be omitted and, if the sensor upper cap 115 is omitted, the package cap 116 may play a role identical to that of the sensor upper cap 115. When the package cap 116 plays a role identical to that of the sensor upper cap 115, a convex stopper may be formed at a portion of the package cap 116 facing the upper surface of the sensor 109.

The package cap 116 contains an organic material such as an insulating resin, for example, an epoxy resin, an acrylic resin, a polyimide resin, or the like is used. The package cap 116 is bonded to the upper surface of the substrate 101 with an adhesive (not shown). However, the sensor 109 is not sealed with resin, and the inside of the package cap 116 is hollow. That is, the acceleration sensor 100 uses a hollow package.

In FIG. 1, 120 denotes a potting resin. The potting resin 120 is applied to the electrode pads 113 of the sensor 109 and the electrode pads 140 of the control IC 106 to cover the electrode pads 113 and the electrode pads 140. The potting resin 120 is applied after the electrode pads 113 of the sensor 109 and the through electrodes 105 and the electrode pads 140 of the control IC 106 and the through electrodes 105 are connected with the bonding wires 118 and the through electrodes 105 and the electrode pads 140 of the control IC 106 are connected with the bonding wires 117. Since the potting resin 120 is applied on the electrode pads 113 of the sensor 109 and the electrode pads 140 of the control IC 106, the bonding wires 117 and 118 are partially exposed. For the potting resin 120, it is desirable to select a resin material having insulating properties such as a silicon-based resin, an acrylic-based resin, an epoxy-based resin, a polyimide-based resin, or a urethane-based resin, and applicable to electrode pads after wire bonding. Also, as the potting resin 120, it is desirable to select a material having a low water absorption property (percentage of water absorption). Note that the percentage of water absorption is used as an index for evaluating humidity resistance of the potting resin 120. This percentage of water absorption can be found by, for example, storing a resin in a constant temperature chamber at a temperature of 85° C. and a humidity of 85% RH, measuring a change in mass of the resin before storage and after storage for 72 hours, and calculating a ratio of water occupying the mass of the resin. By using the measurement condition described above, the percentage of water absorption of each of a silicon-based resin, an acrylic-based resin, an epoxy-based resin, a polyimide-based resin, and a urethane-based resin was measured, and the results were such that the percentage of water absorption of the silicon-based resin was 0.02%, the percentage of water absorption of the acrylic-based resin was 0.68%, the percentage of water absorption of the epoxy-based resin was 1.0%, the percentage of water absorption of the polyimide-based resin was 0.12%, and the percentage of water absorption of the urethane-based resin was 0.6%. Thus, as the potting resin 120, it is desirable to select the silicon-based resin having a low percentage of water absorption. Also, as a specific example of the silicon-based resin, the percentage of water absorption of Model: X35-247N (manufactured by Shin-Etsu Chemical Co., Ltd.) was measured, and the result was 0.12%.

The potting resin 120 is applied to prevent corrosion of the electrode pads from outside air with high humidity. Therefore, it is effective to coat the electrode pads using a metal material that is prone to oxidation with moisture in air, such as Al—Si, Al—Si—Cu, or Al—Nd, with the potting resin 120 with a low percentage of water absorption. Also, by limiting the coating area of the potting resin 120 on the electrode pads after wire bonding, the occurrence of warpage of the sensor 109 due to coating with the potting resin 120 can be prevented, and the influence of stress to be applied to the sensor 109 due to the potting resin 120 can be reduced, thereby preventing an adverse effect on the offset voltage and sensitivity characteristics of the acceleration sensor 100. Thus, as the material for use as the potting resin 120, it is desirable to select a resin material with a low flexural modulus of elasticity from among the silicon-based resin, the acrylic-based resin, the epoxy-based resin, the polyimide-based resin, and the urethane-based resin.

[Acceleration Sensor Manufacturing Method]

A method of manufacturing the acceleration sensor 100 is described with reference to FIG. 2 and FIG. 3. Note that FIG. 2 and FIG. 3 show each manufacturing process based on the sectional views of the acceleration sensor 100 shown in FIG. 1.

(1) Semiconductor Substrate Processing (Refer to FIG. 2(A))

After the piezoresistive elements are formed on the semiconductor substrate, the fixed part 110, the flexible part 111, and the weight part 112 are formed by etching, thereby forming the sensor 109 having the fixed part 110, the flexible part 111, and the weight part 112. As an etching method, DRIE (Deep Reactive Iron Etching) can be used.

(2) Bonding of the Sensor Upper Cap and the Sensor Lower Cap (Refer to FIG. 2(B))

Next, the electrode pads 113 are formed at a predetermined position on the upper surface of the sensor 109. Next, the sensor lower cap 107 formed of a Si substrate or the like is bonded to a lower surface of the sensor 109 in the drawing by resin bonding or the like, and the sensor upper cap 115 is bonded to an upper surface of the sensor 109 in the drawing with the resin 114 or the like.

(3) Substrate Processing and Adhesion of the Control IC (Refer to FIG. 2(C))

Next, the substrate 101 including the wiring layer 102, the insulating layer 103, and the wiring layer 104 is manufactured, and the through electrodes 105 are formed at portions shown in the drawing. The through electrodes 105 are each formed by, for example, forming a recessed part (not shown) penetrating through the substrate 101 and filling the recessed part with a conductive material. Next, the control IC 106 is adhered to the upper surface of the substrate 101 in the drawing where the through electrodes 105 are formed with die attach (die bonding) 108 or the like.

(4) Adhesion of the Sensor, Wiring, and Resin Potting (Refer to FIG. 3(A))

Next, the sensor 109 shown in FIG. 2(B) is adhered to the upper surface of the control IC 106 shown in FIG. 2(C) with the die attach (die bonding) 108 or the like. Next, each electrode pad 113 of the sensor 109 and each through electrode 105 of the substrate 101 are connected with the bonding wire 118, and one of the electrode pads 140 formed on the upper surface of the control IC 106 (on a right side in the drawing) and the through electrodes 105 of the substrate 101 are connected respectively with the bonding wire 118. The other one of the electrode pads 140 formed on the upper surface of the control IC 106 (on a left side in the drawing) and the through electrodes 105 of the substrate 101 are connected respectively with the bonding wire 117. Next, the potting resin 120 is applied on the electrode pads 113 of the sensor 109 which is connected to the bonding wire 118 and the one and the other electrode pads 140 of the control IC 106, which are connected to the bonding wire 117, thereby covering the electrode pads 113 and the electrode pads 140 with the potting resin 120. Note that an example of the process of connecting the bonding wires 117 and 118 and the coating process with the potting resin 120 are described in detail with reference to FIG. 4 to FIG. 7. FIG. 4 to FIG. 7 shows plan views of the acceleration sensor 100 viewed from an upper surface side, excluding the package cap 116 of the acceleration sensor 100 shown in FIG. 1(A) and in the state the sensor upper cap 115 is bonded.

Figure 4:
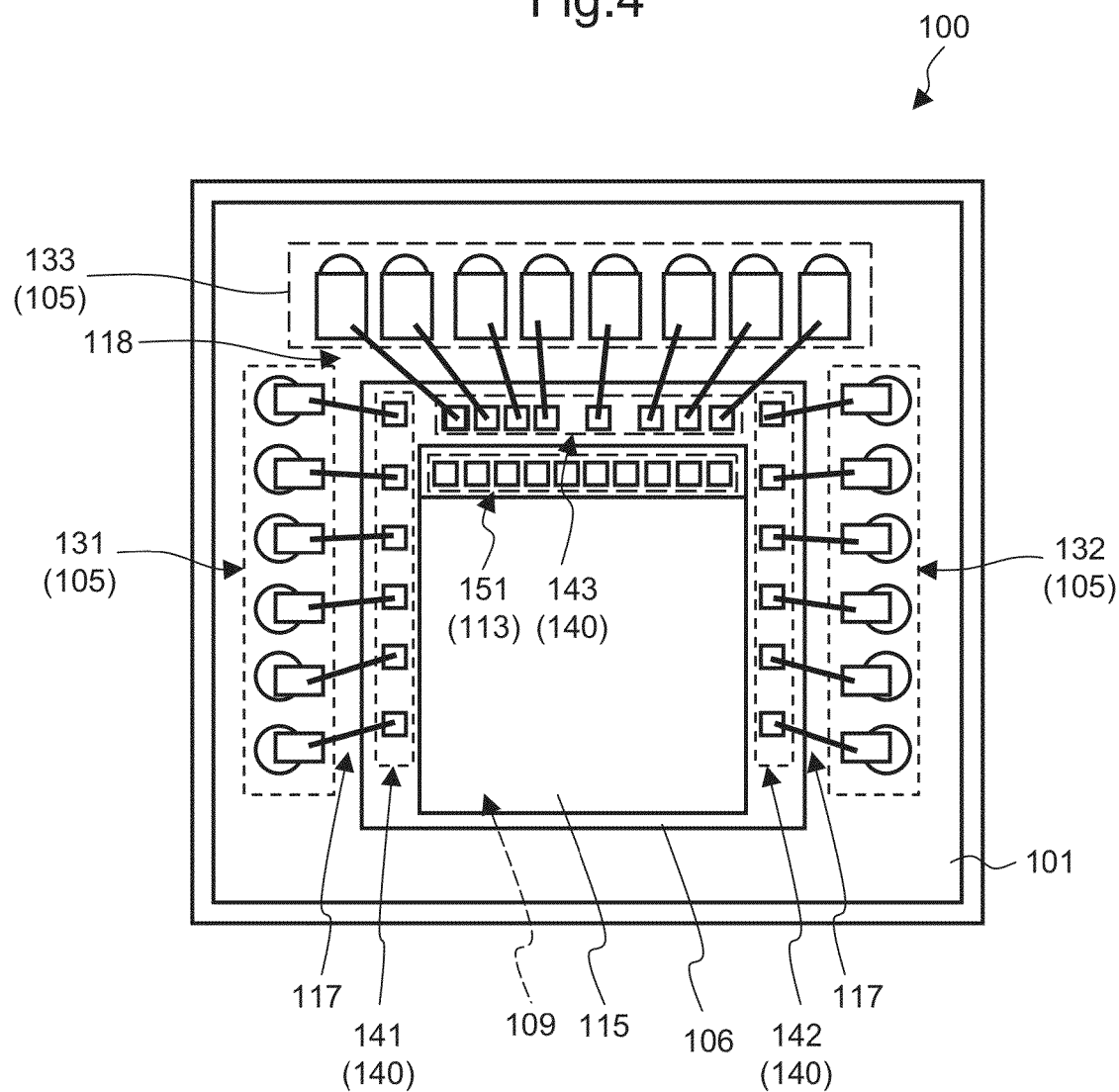
FIG. 4 shows a plan view of the acceleration sensor for describing a part of the bonding wire connecting process of FIG. 3(A)

(4-1) Connection of the Substrate and the Control IC with Bonding Wires (Refer to FIG. 4)

Referring to FIG. 4, first, the electrode groups 131 to 133 of the substrate 101 and the electrode groups 141 to 143 of the control IC 106 are connected with the plurality of bonding wires 117 and 118.

Figure 5:
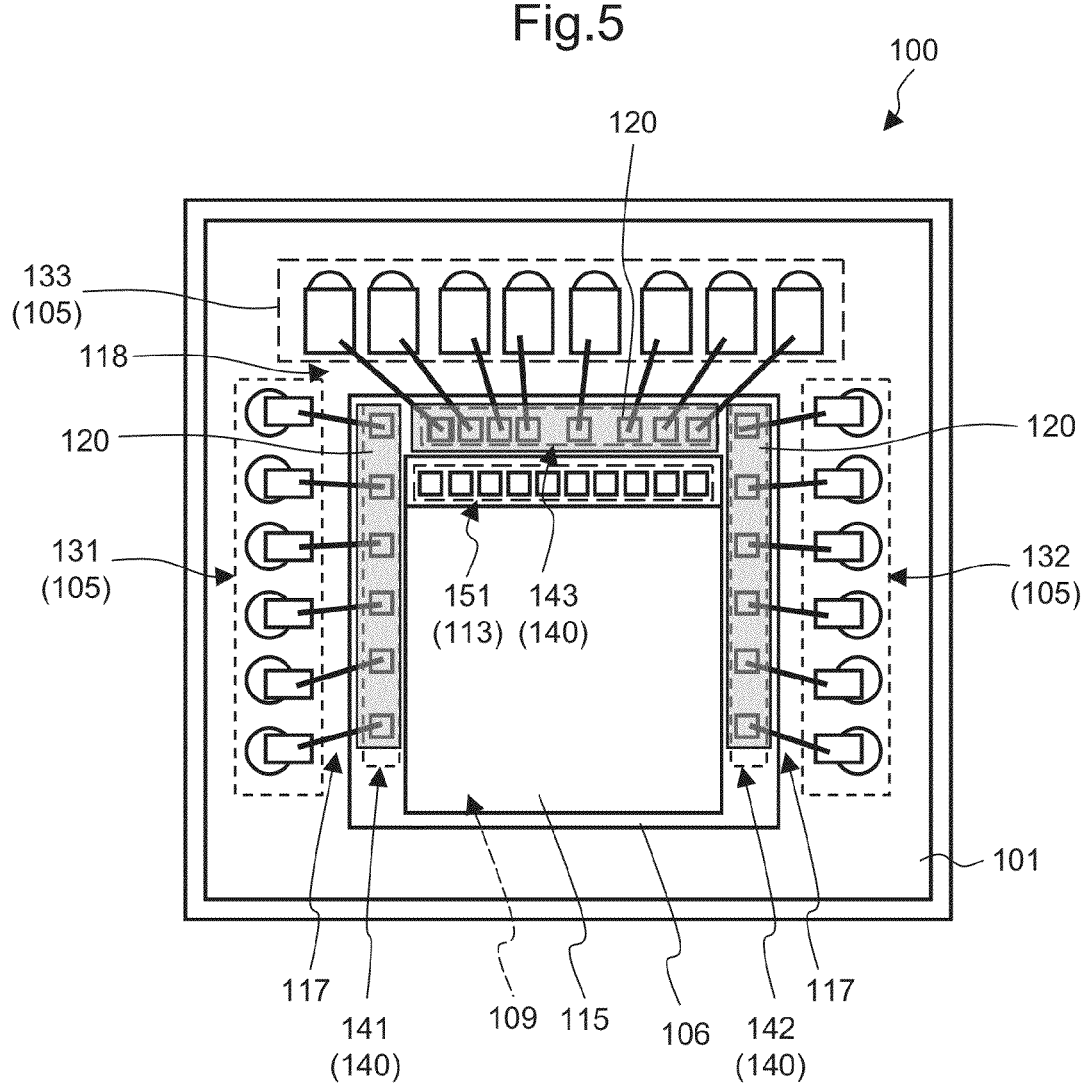
FIG. 5 shows plan view of the acceleration sensor for describing a part of the potting resin coating process of FIG. 3(A)

(4-2) Resin Sealing of Each Electrode Group of the Control IC (Refer to FIG. 5)

Next, each of the electrode groups 141 to 143 of the control IC 106 is coated with the potting resin 120, thereby covering each of the electrode groups 141 to 143 with the potting resin 120.

Figure 6:
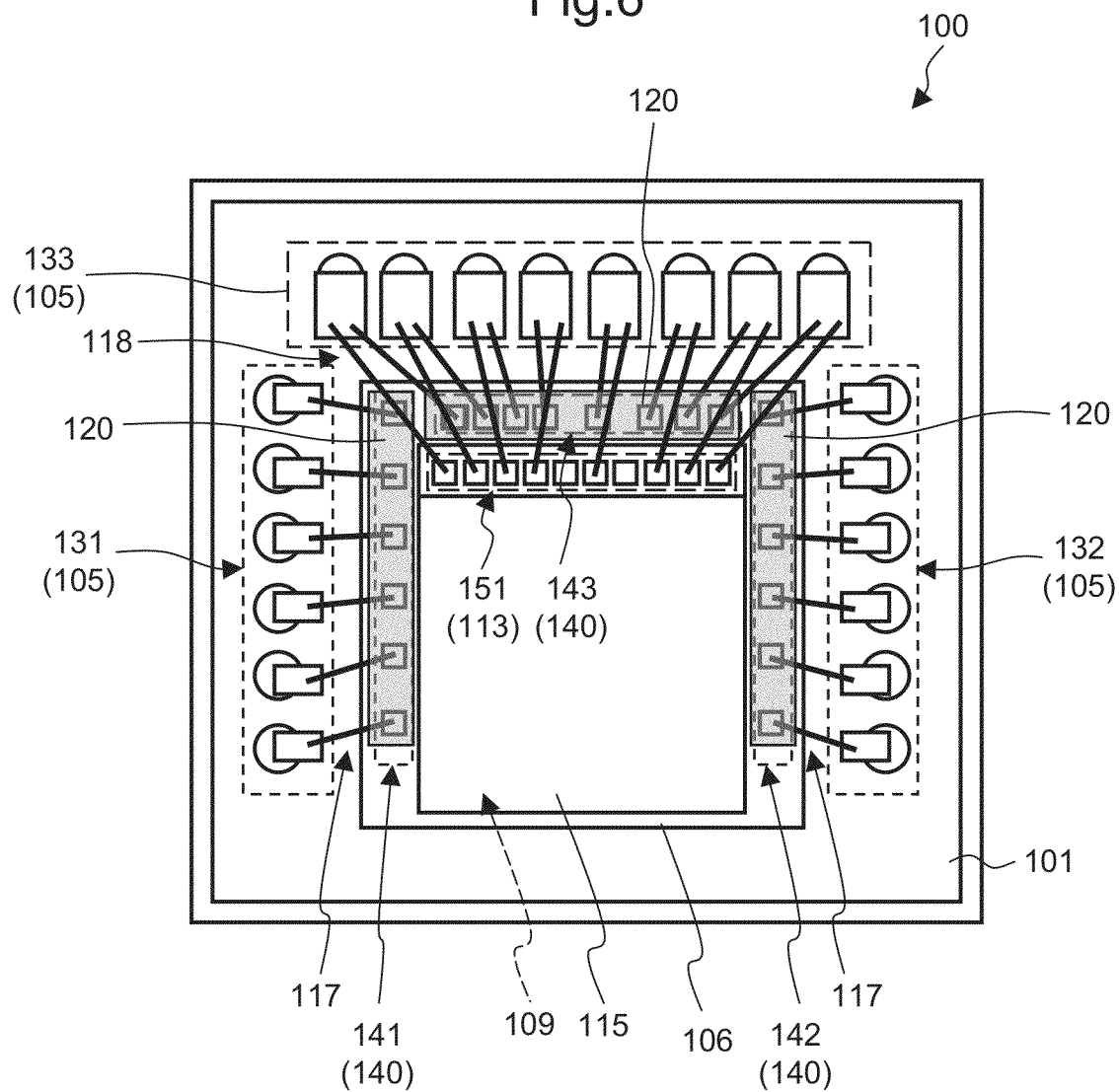
FIG. 6 shows a plan view of the acceleration sensor for describing a part of the bonding wire connecting process of FIG. 3(A)

(4-3) Connection of the Substrate and the Sensor with Bonding Wires (Refer to FIG. 6)

Next, the electrode group 133 of the substrate 101 and the electrode group 151 of the sensor 109 are connected with the plurality of boding wires 118.

Figure 7:
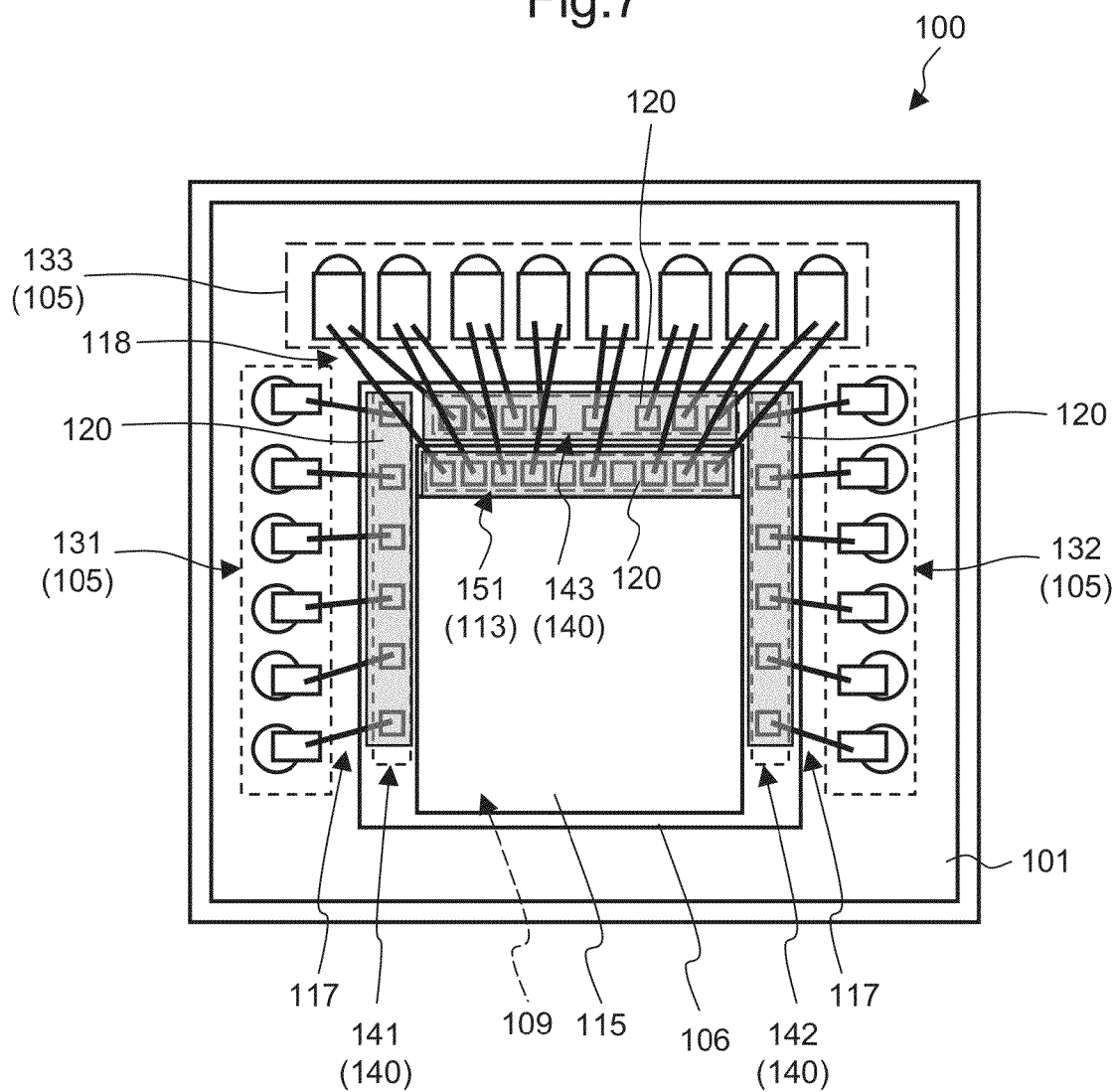
FIG. 7 shows a plan view of the acceleration sensor for describing a part of the potting resin coating process of FIG. 3(A)
Figure 8:
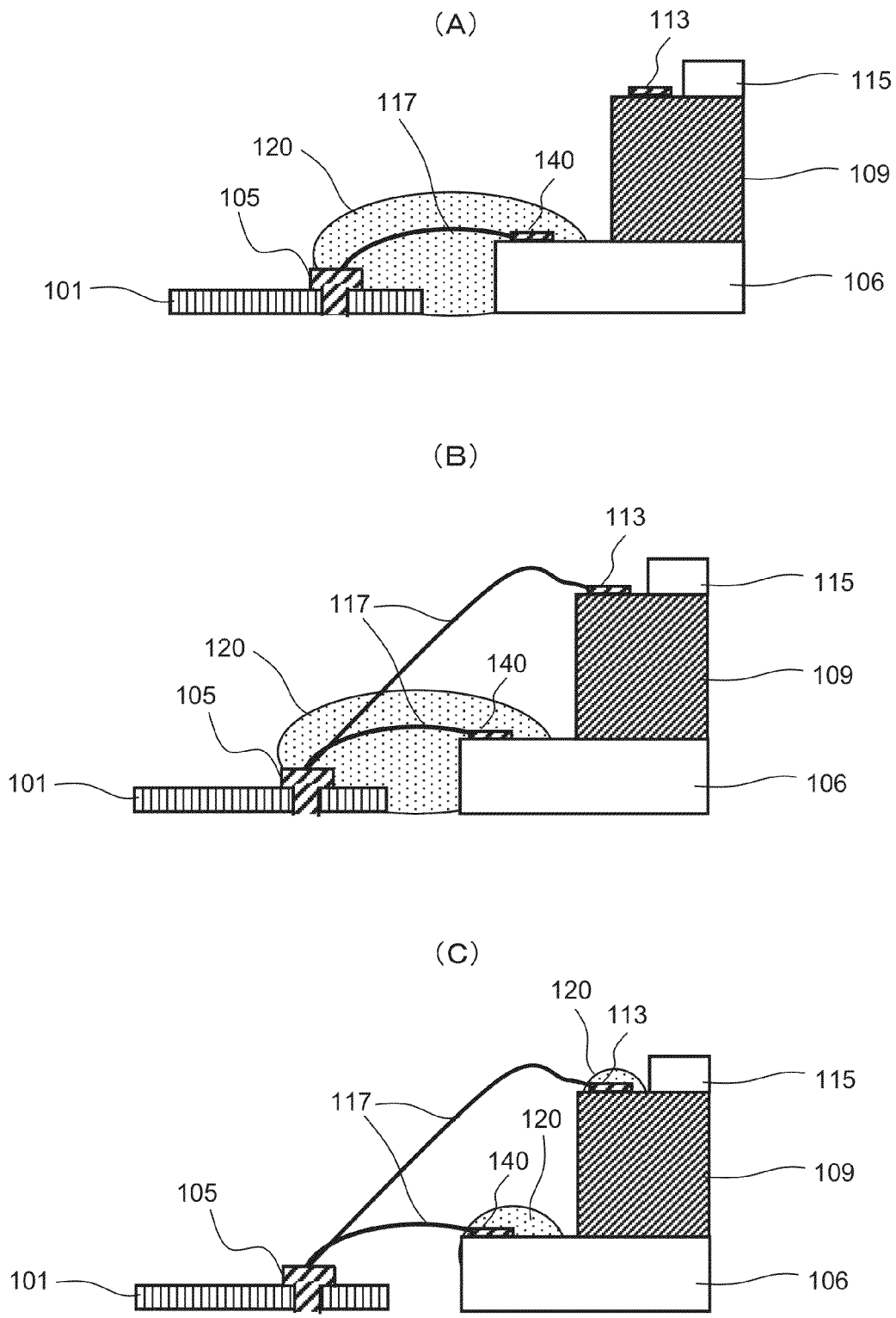
FIG. 8 shows partial sectional views of the acceleration sensor for describing a coating position of a potting resin according to the first embodiment.

(4-4) Resin Potting of the Electrode Group of the Sensor (Refer to FIG. 7)

Next, the electrode group 151 of the sensor 109 is coated with the potting resin 120, thereby covering the electrode group 151 with the potting resin 120. The series of (4-1) to (4-4) described above is an example of the process of connecting with the bonding wires 117 and 118 and the process of coating with the potting resin 120.

(5) Package Cap Bonding (Refer to FIG. 3(B))

Next, the package cap 116 is bonded with an adhesive (not shown) on the upper surface of the substrate 101, thereby covering the sensor 109, the plurality of electrode pads 113 of the sensor 109, the plurality of electrode pads 140 of the control IC 106, and the plurality of through electrodes 105 of the substrate 101 for sealing. However, the sensor 109 and the control IC 106 are not sealed with resin, and the inside of the package cap 116 is hollow.

(Coating Position of Potting Resin)

Figure 9:
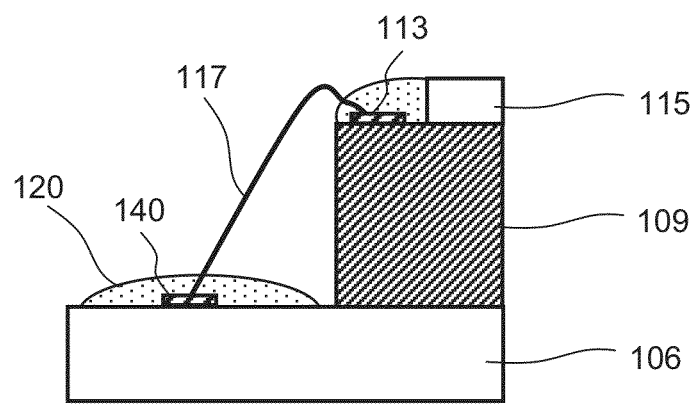
FIG. 9 shows a partial sectional view of the acceleration sensor for describing a coating position of a potting resin according to the first embodiment, being a partial sectional view of the acceleration sensor for describing a process of covering electrode pads of a control IC and the electrode pads of the sensor with a potting resin.

Next, the coating position of resin potting is described with reference to partial sectional views of the acceleration sensor shown in FIG. 8(A), FIG. 8(B), FIG. 8(C) and FIG. 9. FIG. 8(A) shows a partial sectional view of an example of the state in which the through electrodes of the substrate, the bonding wires, and the electrode pads of the control IC are sealed with the potting resin. FIG. 8(B) shows a partial sectional view of another example of the state in which the through electrodes of the substrate, the bonding wires, and the electrode pads of the control IC are sealed with the potting resin. FIG. 8(C) shows a partial sectional view of still another example of the state in which the through electrodes and each electrode pad of the sensor are coated with the potting resin. FIG. 9 shows a partial sectional view of an example of the state in which the electrode pads of the control IC and the electrode pads of the sensor are sealed with the potting resin. Note that FIG. 8(A), FIG. 8(B), FIG. 8(C) and FIG. 9 are sectional views showing a part of the structure of each portion of the through electrodes 105 of the substrate 101, the electrode pads 140 of the control IC 106, and the electrode pads 113 of the sensor 109 in a simplified manner. Also, in FIG. 8(A), FIG. 8(B), FIG. 8(C) and FIG. 9, a structure identical to structures of the acceleration sensor 100 shown in FIG. 1 to FIG. 7 are provided with the same reference numeral.

FIG. 8(A) shows the state in which a region including the through electrode 105, the electrode pad 140, and the bonding wire 117 is coated and sealed with the potting resin 120 after the through electrode 105 of the substrate 101 and the electrode pad 140 of the control IC are connected with the bonding wire 117. As such, if the region including the through electrode 105, the electrode pad 140, and the bonding wire 117 is coated with the potting resin 120, as described in FIG. 8(B), a connection between the through electrode 105 of the substrate 101 and the electrode pad 113 of the sensor 109 with the bonding wire 117 becomes difficult due to the potting resin 120.

Thus, as shown in FIG. 8(C) or FIG. 9, after the electrode pad 140 of the control IC 106 and the electrode pad 113 of the sensor 109 are connected with the bonding wire 117, the electrode pad 140 and the electrode pad 113 are each coated sealed with the potting resin 120.

Note that since the potting resin 120 is only applied on the electrode pad 140 and on the electrode pad 113 as shown in FIG. 9, oxidation of the electrode pad 140 and the electrode pad 113 can be prevented, and the occurrence of warpage of the sensor 109 due to the potting resin 120 can also be prevented.

Therefore, as shown in FIG. 9, it is desirable that, after the electrode pad 140 of the control IC 106 and the electrode pad 113 of the sensor 109 are connected with the bonding wire, each of the electrode pads 113 and 140 are coated and covered with the potting resin 120. The same goes for a procedure of connecting among the through electrode 105 of the substrate 101, the electrode pad 140 on the control IC 106, and the electrode pad 113 on the sensor 109 with the bonding wires 117 and 118 and a procedure of coating of the through electrode 105 and the electrode pads 113 and 140 with the potting resin 120 shown in FIG. 4 to FIG. 7 described above. Therefore, in the acceleration sensor 100 described in FIG. 7, by coating and covering the electrode groups 141 to 143 having the plurality of electrode pads 140 of the control IC 106 and the electrode groups 151 having the plurality of electrode pads 113 of the sensor 109 with the potting resin 120, oxidation of the electrode pads 140 and the electrode pads 113 can be prevented, and the occurrence of the sensor 109 due to the potting resin 120 can also be prevented.

(Specific Example of Resin Potting)

Next, a specific example when the potting resin is applied on the electrode pad of the sensor is shown in FIG. 10(A) and FIG. 10(B). FIG. 10(A) shows a plan view of a sensor viewed from its upper surface before coating with the potting resin, and FIG. 10(B) shows a plan view of the sensor viewed from the upper surface after coating with the potting resin. In FIG. 10(A) and FIG. 10(B), 301 denotes a sensor, 302 denotes electrode pads formed on the sensor 301, 303 denotes electrode pads formed on a substrate, and 304 denotes a bonding wire. First, referring to FIG. 10(A), each of the electrode pads 302 of the sensor 301 and each of the electrode pads 303 of the substrate were connected with the bonding wire 304 respectively. Next, referring to FIG. 10(B), the electrode pads 302 of the sensor 301 were coated with a potting resin 401.

Figure 11:
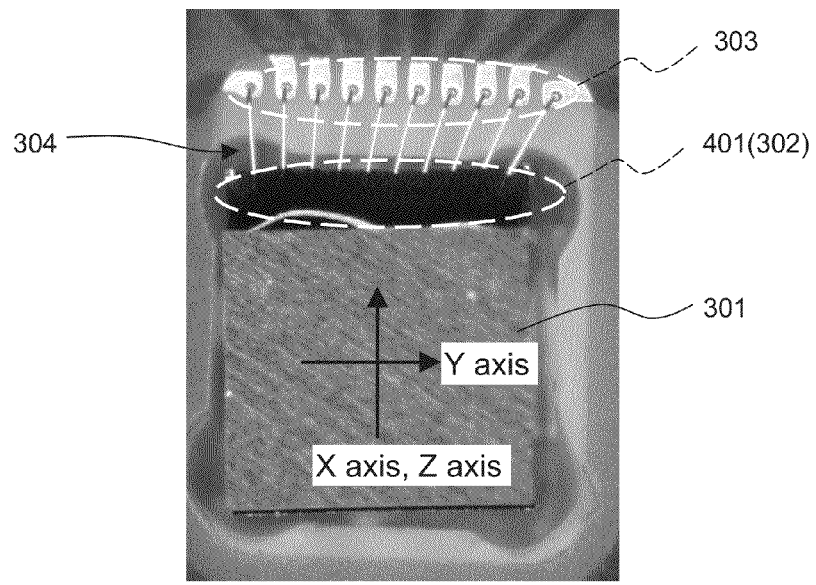
FIG. 11 shows a plan view of the acceleration sensor depicting an acceleration detection direction of an offset voltage measurement target according to the first embodiment.
Figure 12:
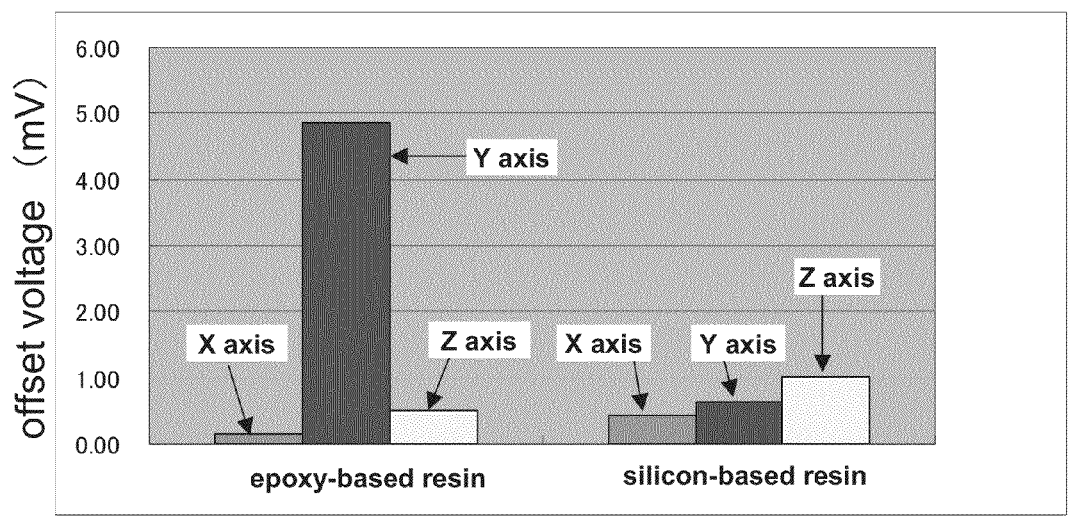
FIG. 12 shows a graph showing measurement results of offset voltages of XYZ three axes of the acceleration sensor of FIG. 11.

Next, a shift in offset voltage occurring in the sensor 301 was measured when the electrode pads 302 of the sensor 301 shown in FIG. 10(B) were coated with an epoxy-based resin or a silicon-based resin as the potting resin 120. The measurement results of the shift in offset voltage are described with reference to FIG. 11 and FIG. 12. FIG. 11 shows a plan view of the acceleration sensor and acceleration detection directions of an offset voltage shift measurement target. FIG. 12 shows a graph showing measurement results of offset voltages with respect to respective acceleration detection directions of the acceleration sensor described in FIG. 11 after coating with the epoxy-based resin or the silicon-based resin.

As shown in FIG. 11, the electrode pads 302 of the sensor 301 were coated with an epoxy-based resin or a silicon-based resin as the potting resin 401. Also, offset voltages in X, Y and Z axis directions shown in FIG. 11 were measured. Note that in the sensor 301, the plurality of piezoresistive elements detecting a displacement of the flexible part 111 shown in FIG. 1 in the XYZ three axis directions are such that a plurality of piezoresistive elements detecting an acceleration in the Y axis direction are arranged in the Y axis direction in the drawing and a plurality of piezoresistive elements detecting an acceleration in the X and Z axis directions are arranged in the X and Z axis directions in the drawing. FIG. 12 shows a graph showing the measurement results of offset voltages [mV] in the XYZ three axis direction in the case of coating with an epoxy-based resin having a flexural modulus of elasticity of 18 [GPa] and coating with a silicon-based resin having a flexural modulus of elasticity of 18 [GPa] as the potting resin 401 for comparison. In these measurement results, in the case of coating with the epoxy-base resin as the potting resin 401, a shift in offset voltage in the Y axis direction is approximately 4.8 [mV], which is large compared with shifts in offset voltage in the X and Z directions. Also, in the case of coating with the silicon-based resin as the potting resin 401, a shift in each of the XYZ three axis direction was equal to or smaller than 1.0 [mV]. From these results, to suppress a shift in offset voltage, it has been found that it is desirable to select the silicon-based resin as the potting resin 401. In this measurement, Model: ES-347-1 (manufactured by Sanyu Rec Co., Ltd., and having a flexural modulus of elasticity of 18 [GPa] (the flexural modulus of elasticity was measured by JIS K9611)) was used as the epoxy-based resin, and Model: TSJ3155B (Momentive Performance Materials Inc. durometer hardness: 70 to 82) was used as the silicon-based resin.

The shift in offset voltage occurring to the sensor 301 in the case of coating with the epoxy-based resin in FIG. 12 is due to the magnitude of stress given from the epoxy-based resin to the sensor 301 after coating with the epoxy-based resin. That is, this is due to the degree of warpage caused in the sensor 301 by the flexural modulus of elasticity of the epoxy-based resin. Thus, the flexural modulus of elasticity of the epoxy-based resin was changed, offset voltages in the XYZ three axis directions of the sensor 301 were measured, and the usable range of the flexural modulus of elasticity of the epoxy-based resin with a decreased shift in offset voltage was verified. The results are shown in FIG. 13.

Figure 13:
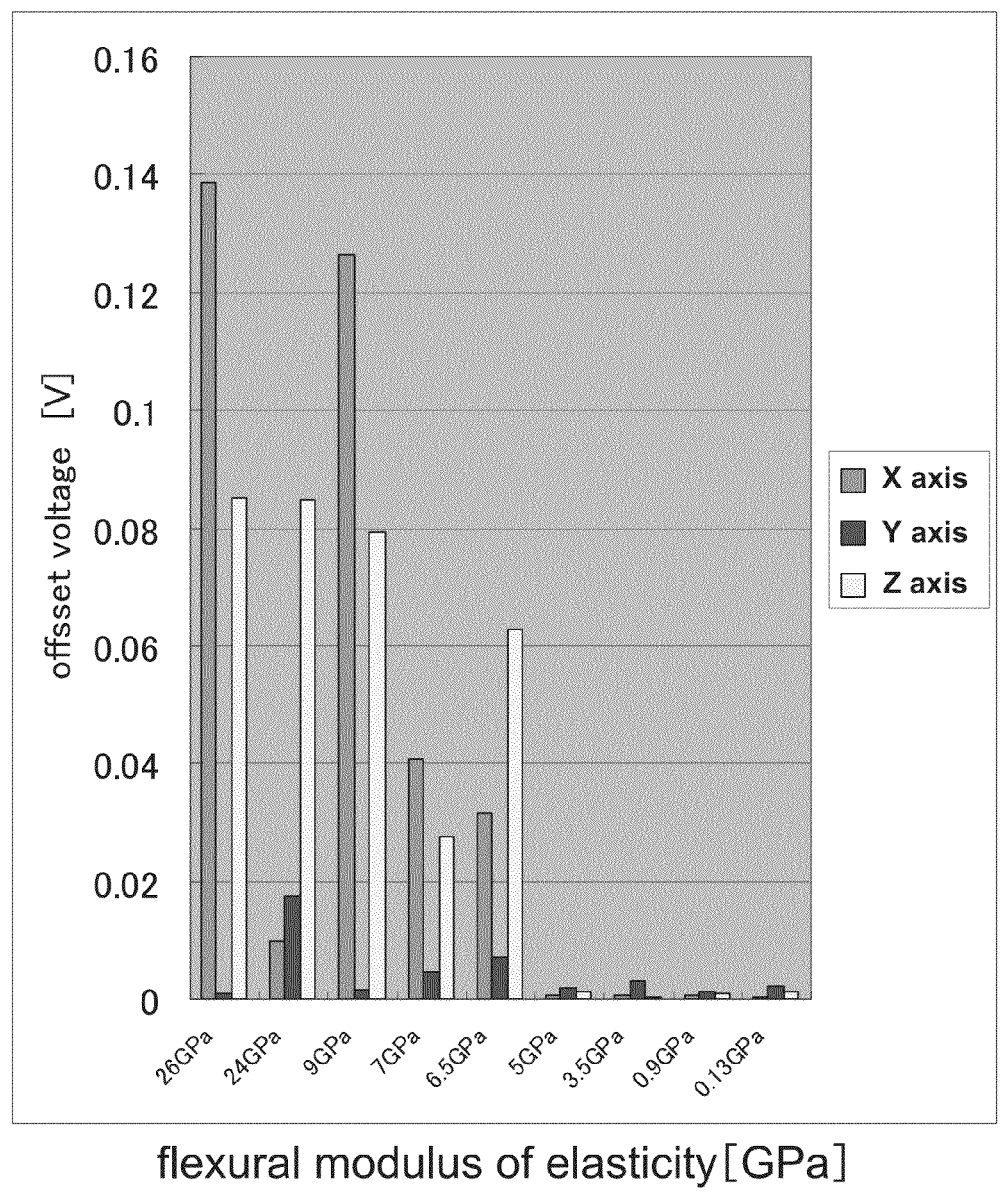
FIG. 13 shows a graph showing measurement results of offset voltages of XYZ three axes when an epoxy-based resin is used as the potting resin according to the first embodiment to change a flexural modulus of elasticity.

FIG. 13 is a graph depicting the results obtained by measuring offset voltages in XYZ three axis directions of the sensor 301 when epoxy-based resins having flexural moduli of elasticity of 26 [GPa], 24 [GPa], 9 [GPa], 7 [GPa], 6.5 [GPa], 5 [GPa], 3.5 [GPa], 0.9 [GPa], and 0.13 [GPa], are used to mold the entire sensor. As is evident from this graph, it has been found that the shifts in offset voltages in the XYZ three axis directions of the sensor 301 are decreased when the epoxy-based resins having flexural moduli of elasticity of 5 [GPa] to 0.13 [GPa] is used. Therefore, when an epoxy-based resin is used as the potting resin 401, it is desirable to use the one having a flexural modulus of elasticity equal to or smaller than 5 [GPa]. Also, the measurement results of the offset voltages shown in FIG. 13 are in the case in which the epoxy-based resin is used to mold the entire sensor. Therefore, even if the electrode pad 113 and the electrode pad 140 are coated with the epoxy-based resin as shown in FIG. 9, the influence of stress given from the epoxy-based resin to the sensor 109 is small, and does not pose a problem regarding a shift in offset voltage. Note that the flexural moduli of elasticity of the epoxy-based resins were measured based on JIS K6911.

As described above, in the acceleration sensor according to the first embodiment of the present invention, after the through electrode of the substrate, the electrode pad of the sensor, and the electrode pad of the control IC are connected with bonding wires, a minimum region on the electrode pad of the sensor and the electrode pad of the control IC is coated and covered with a potting resin using a resin material in consideration of hygroscopicity and the flexural modulus of elasticity. With this, it is possible to prevent corrosion of the electrode pads due to outside air with high humidity, prevent the occurrence of warpage of the sensor due to coating with potting resin, and reduce the influence of stress by the potting resin to the sensor. As a result, the influence of the acceleration sensor on sensor characteristics can be minimized, and the reliability of the acceleration sensor can be improved.

Note that while the acceleration sensor has been described as an example in the first embodiment of the present invention, this is not meant to be restrictive, and the present embodiment can be applied to another mechanical quantity sensor such as an angular velocity sensor. Also, while coating with a silicon resin or an epoxy-based resin as a potting resin has been described as an example in the first embodiment of the present invention, any resin material can be used as long as it satisfies each of the conditions of hygroscopicity and flexural modulus of elasticity described above, and the resin material is not particularly restricted to the above.

Second Embodiment

In a second embodiment of the present invention, an example of an acceleration sensor is described as a sensor device with reference to FIG. 14 to FIG. 17. In the second embodiment, an example in which electrode pads of a control IC and electrode pads of a sensor are individually coated with a potting resin is described.

Figure 14:
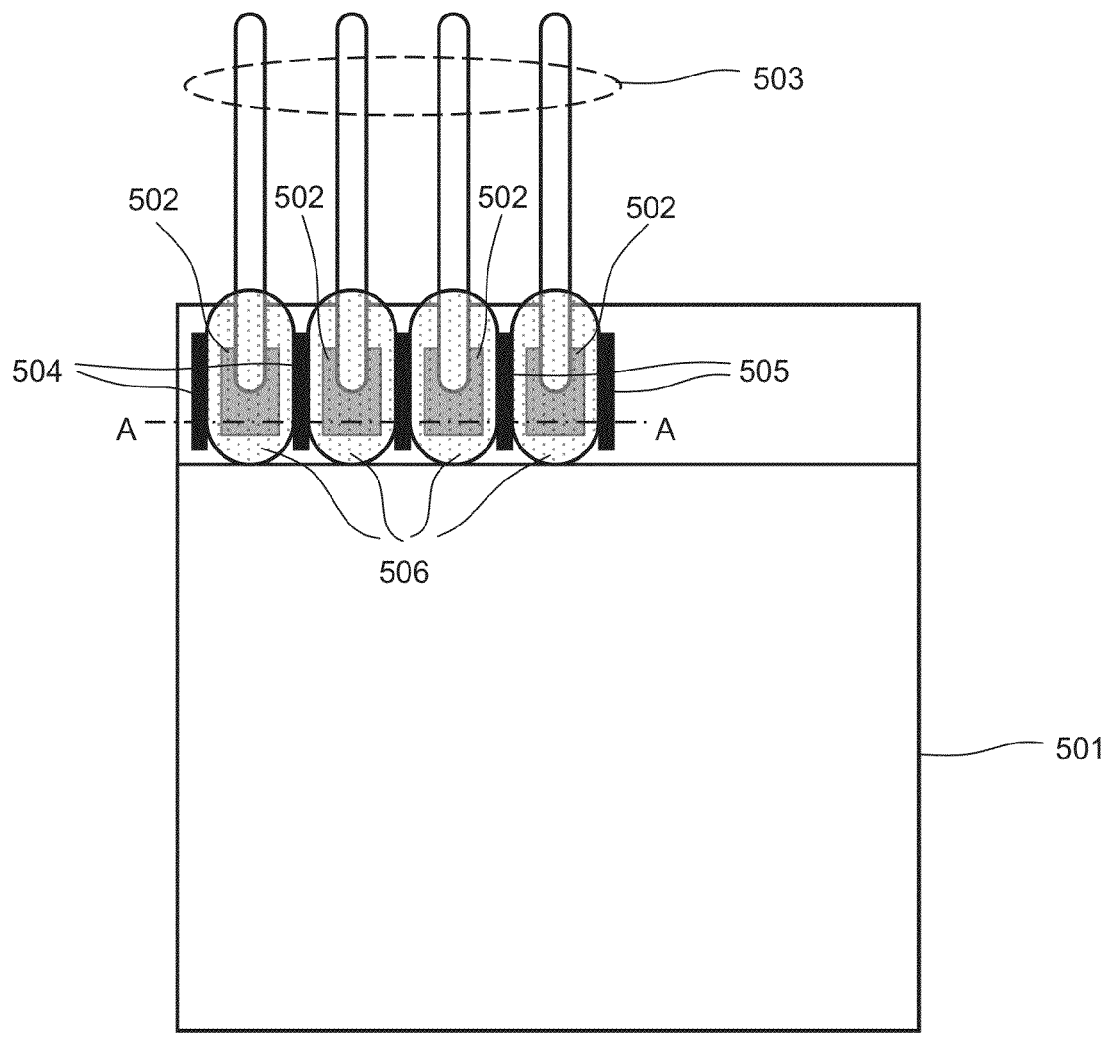
FIG. 14 shows a plan view of a schematic structure of an acceleration sensor according to a second embodiment of the present invention.

FIG. 14 shows a plan view of a schematic structure of an acceleration sensor 500. Note that the entire structure of the acceleration sensor 500 is similar to that of the acceleration sensor 100 shown in FIG. 1 and is therefore not depicted herein, and description of the structure is omitted herein. In FIG. 14, the acceleration sensor 500 includes a sensor 501, where a plurality of electrode pads 502 are formed in an upper region in the drawing. Each of the plurality of electrode pads 502 is connected to a bonding wire 503 respectively. Also, between the plurality of electrode pads 502, a plurality of isolating parts 505 for isolating a potting resin 506 applied to each of the electrode pads 502 are formed. The acceleration sensor 500 according to the second embodiment of the present invention has a feature in which the plurality of isolating parts 505 for isolating the potting resin 506 are formed between the plurality of electrode pads 502.

[Isolating Part Manufacturing Method 1]

FIG. 15(A) and FIG. 15(B) show partial sectional views along an A-A line of FIG. 14, and are drawings of an example of a method of manufacturing the isolating part 505 between the electrode pads 502.

(1) Formation of Electrode Pads and Isolating Parts (Refer to FIG. 15(A))

In FIG. 15(A), 501 denotes a semiconductor substrate of two layers formed of a Si layer 511 and a SiO$_2$ layer 512. A plurality of electrodes 513 are formed by patterning or the like by using Al—Nd or the like at positions corresponding to electrode pad formation positions on an upper surface of this semiconductor substrate 501. In this case, also formed are dummy electrodes 513a each for forming an isolating member between formation positions of the electrode pads 502, which will be described further below. Next, a SiN layer 514 is formed on the upper surface of the semiconductor substrate 501 on which the plurality of electrodes 513 and the dummy electrode 513a are formed, and the SiN layer 514 is etched with a mask (not shown) to form a plurality of recessed parts (not shown) at positions where the electrode pads 502 are to be formed. Next, the plurality of electrode pads 502 are formed on positions corresponding to the plurality of recessed parts by patterning Al. As shown in FIG. 15(A), a projection 505 is formed on the SiN layer 514 at a portion where the dummy electrode 513a is formed, and this projection 505 serves as an isolating part.

(2) Wire Bonding and Resin Potting (Refer to FIG. 15(B))

Next, the bonding wire 503 is connected to each of the plurality of the electrode pads 502. Next, the electrode pads 502 are each coated with the potting resin 506, thereby covering each of the electrode pads 502 with the potting resin 506. With formation of the projection 505 serving as an isolating part, it is possible to prevent the potting resin 506 with which each of the electrode pads 502 is coated from spreading over the adjacent electrode pad 502. For this reason, since the coating region of the potting resin 506 is for each electrode pad 502, the influence of stress given from the potting resin to the sensor is reduced more compared with the case described in the first embodiment in which coating with the potting resin is performed for each electrode group each having a plurality of electrode pads.

[Isolating Part Manufacturing Method 2]

FIG. 16(A) and FIG. 16(B) show partial sectional views along an A-A line of FIG. 14, showing an example of a method of manufacturing the isolating part 521 between the electrode pads 502. Note in FIG. 16(A) and FIG. 16(B) that portions having structures identical to the structures depicted in FIG. 15(A) and FIG. 15(B) are provided with the same reference numeral.

(1) Formation of Electrode Pads and Isolating Parts (Refer to FIG. 16(A))

In FIG. 16(A), first, a plurality of electrodes 513 are formed by patterning or the like by using Al—Nd or the like at positions corresponding to electrode pad formation positions on an upper surface of the semiconductor substrate 501. Next, a SiN layer 514 is formed on the upper surface of the semiconductor substrate 501 on which the plurality of electrodes 513 are formed, and the SiN layer 514 is etched with a mask (not shown) to form a plurality of recessed parts (not shown) at positions where the electrode pads 502 are to be formed. Next, the plurality of electrode pads 502 are formed on positions corresponding to the plurality of recessed parts by patterning Al. At the same time, a dummy electrode 521 is formed by using Al—Nd or the like on an upper surface of the SiN layer 514 between the plurality of electrode pads 502. This dummy electrode 521 serves as an isolating part.

(2) Wire Bonding and Resin Potting (Refer to FIG. 16(B))

Next, the bonding wire 503 is connected to each of the plurality of the electrode pads 502. Next, the electrode pads 502 are coated with the potting resin 506, thereby covering the electrode pads 502. With formation of the dummy electrode 521 serving as an isolating part, it is possible to prevent the potting resin 506 with which each of the electrode pads 502 is coated from spreading over the adjacent electrode pad 502. For this reason, since the coating region of the potting resin 506 is for each electrode pad 502, the influence of stress given from the potting resin to the sensor is reduced more compared with the case described in the first embodiment in which coating with the potting resin is performed for each electrode group each having a plurality of electrode pads.

(Specific Example of Resin Potting)

Figure 17:
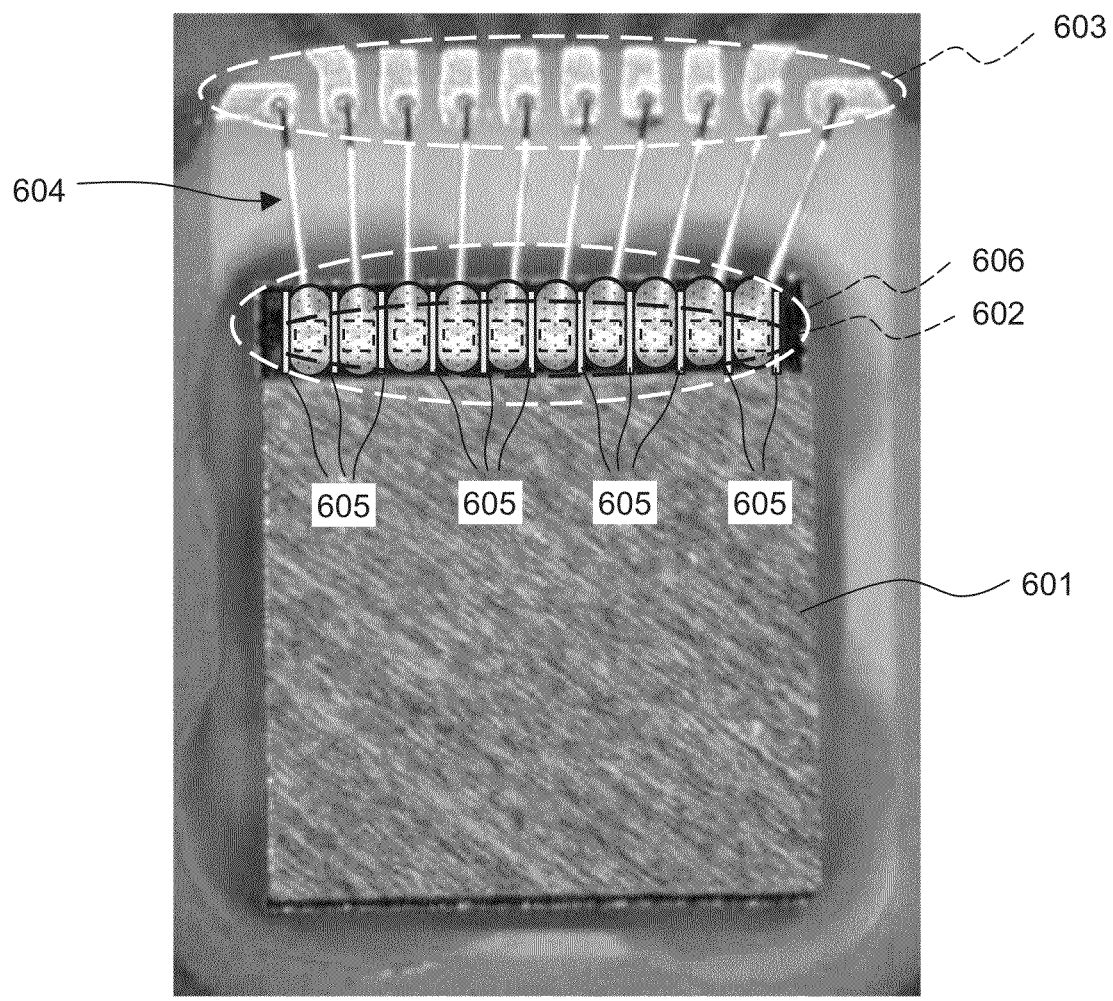
FIG. 17 shows a plan view depicting the sensor structure for describing a specific example of resin potting of the acceleration sensor according to the second embodiment.

Next, a specific example of coating with a potting resin on electrode pads of a sensor is shown in FIG. 17. In FIG. 17, 601 denotes a sensor, 602 denotes a plurality of electrode pads made of Al formed on the sensor 601, 603 denotes a plurality of electrode pads made of Al formed on a control IC, 604 denotes a plurality of bonding wires, 605 denotes a plurality of isolating parts isolating a potting resin, and 606 denotes a potting resin. First, in FIG. 17, the electrode pads 602 of the sensor 601 and the electrode pads 603 of the control IC were connected with the plurality of bonding wire 604. Next, in FIG. 17, the electrode pads 602 of the sensor 601 were each coated with the potting resin 606. It has been confirmed that, with formation of the isolating part 605 between the plurality of electrode pads 602, the potting resin 606 can be prevented from spreading over the adjacent electrode pad 602.

Note that, as described in the first embodiment, as the material of the potting resin with which coating is made in FIG. 15(B), FIG. 16(B), and FIG. 17, it is desirable to use a silicon-based resin or an epoxy-based resin that satisfies the conditions of hygroscopicity and flexural modulus of elasticity described above. However, any resin material can be used as long as it satisfies each of the conditions of hygroscopicity and flexural modulus of elasticity described above, and the resin material is not particularly restricted to the above. Also, while description has been made to the case in which the projection 505 serving as an isolating part is formed of the dummy electrode 513a in FIG. 15 and the isolating part is formed of the dummy electrode 521 in FIG. 16, an isolating part may be formed of a dummy wiring. Furthermore, the position where the isolating part is formed is not restricted to a space between the plurality of electrode pads 502 of the sensor 501, and an isolating part may be formed between the plurality of electrode pads of the control IC to prevent the potting resin for coating the plurality of electrode pads of the control IC to spread over the adjacent electrode pad. Note that while the case has been described in FIG. 15 and FIG. 16 in which the isolating part is formed of the dummy electrode, an actual electrode or wiring may be used to form an isolating part.

As described above, in the acceleration sensor according to the second embodiment of the present invention, the isolating part for isolating the potting resin is formed between the plurality of electrode pads formed on the sensor, thereby preventing the potting resin with which each electrode pad is coated to spread over the adjacent electrode pad. Therefore, the influence of stress given from the potting resin to the sensor can be reduced more compared with the case in which coating with the potting resin is performed for each electrode group having a plurality of electrode pads. Therefore, according to the acceleration sensor in accordance with the second embodiment of the present invention, after the electrode pad of the control IC and the electrode pad of the sensor are connected with a bonding wire, each of the electrode pad of the sensor is coated with the potting resin using a resin material in consideration of hygroscopicity and flexural modulus of elasticity, thereby preventing corrosion of the electrode pads due to outside air with high humidity. Also, by forming an isolating part between the electrode pads so that the potting resin for coating the electrode pads does not spread over the adjacent electrode pad, the influence of the stress given from the potting resin to the sensor can be reduced, and the occurrence of warpage of the sensor due to coating with the potting resin can be prevented. As a result, reliability of the acceleration sensor can be improved. Note that while the case has been described in the second embodiment in which an isolating part isolating the potting resin is formed for each electrode pad, the structure of the present invention is not restricted to this, and coating with the potting resin may be performed for each electrode pad without forming an isolating part.

What is claimed is:

1. A method for manufacturing a sensor device comprising:
   forming an isolating part between a plurality of metal electrodes of the sensor, the sensor having a fixed part, a movable part positioned inside the fixed part, a flexible part connecting the fixed part and the moveable part, and the plurality of metal electrodes;
   arranging the sensor on a substrate;
   electrically connecting the plurality of metal electrodes of the sensor and a plurality of terminals of the substrate with bonding wires; and
   covering portions of the plurality of metal electrodes of the sensor connected to the bonding wires with a resin so that a part of the bonding wires between the plurality of metal electrodes and the plurality of terminals is exposed,
   wherein the portions where the plurality of metal electrodes of the sensor and the bonding wires are connected are individually covered with the resin,
   the isolating part isolates the resin for each of the plurality of metal electrodes of the sensor, and
   the resin is an epoxy resin material having a flexural modulus of elasticity equal to or smaller than 5 GPa.

2. The method for manufacturing the sensor device according to claim 1, further comprising:
   arranging a control IC between the substrate and the sensor, the control IC having a plurality of metal electrodes;
   electrically connecting the plurality of metal electrodes of the control IC and the plurality of metal electrodes of the sensor and the plurality of terminals of the substrate with the bonding wires; and
   covering portions of the plurality of metal electrodes of the control IC connected to the bonding wires with the resin so that a part of the bonding wires between the plurality of metal electrodes and the plurality of terminals is exposed.

3. The method for manufacturing the sensor device according to claim 2, wherein
   the portions where the plurality of metal electrodes of the control IC and the bonding wires are connected are individually covered with the resin.

4. The method for manufacturing the sensor device according to claim 3, further comprising forming, between the plurality of metal electrodes of the control IC, an isolating part isolating the resin for each of the metal electrodes of the control IC.

5. A sensor device comprising:
   a sensor having a fixed part, a movable part positioned inside the fixed part, a flexible part connecting the fixed part and the movable part, a plurality of metal electrodes and a plurality of isolating parts;
   a substrate having a plurality of terminals and having the sensor mounted thereon; and
   bonding wires electrically connecting the plurality of metal electrodes and the plurality of terminals of the substrate,
   wherein portions where the plurality of metal electrodes of the sensor and the bonding wires are individually connected are covered with a resin,
   a part of the bonding wires between the plurality of metal electrodes and the plurality of terminals is exposed,
   the plurality of isolating parts isolate the resin between the plurality of metal electrodes of the sensor, and
   the resin is an epoxy resin material having a flexural modulus of elasticity equal to or smaller than 5 GPa.

6. The sensor device according to claim 5, further comprising:
   a control IC arranged between the substrate and the sensor and having a plurality of metal electrodes,
   wherein the bonding wires electrically connects the plurality of metal electrodes of the control IC and the plurality of terminals of the substrate,
   portions where the plurality of metal electrodes of the control IC and the bonding wires are connected are covered with the resin, and
   a part of the bonding wires between the plurality of metal electrodes of the control IC and the plurality of terminals is exposed.

7. The sensor device according to claim 6, wherein
   the control IC has a plurality of isolating parts that isolate the resin between the plurality of metal electrodes of the control IC, and
   the portions where the plurality of metal electrodes of the control IC and the bonding wires are connected are individually covered with the resin.

8. The method for manufacturing the sensor device according to claim 1, wherein the epoxy resin material has a flexural modulus of elasticity equal to or greater than 0.13 GPa.

9. The method for manufacturing the sensor device according to claim 2, wherein the epoxy resin material has a flexural modulus of elasticity equal to or greater than 0.13 GPa.

10. The method for manufacturing the sensor device according to claim 3, wherein the epoxy resin material has a flexural modulus of elasticity equal to or greater than 0.13 GPa.

11. The method for manufacturing the sensor device according to claim 4, wherein the epoxy resin material has a flexural modulus of elasticity equal to or greater than 0.13 GPa.

12. The sensor device according to claim 5, wherein the epoxy resin material has a flexural modulus of elasticity equal to or greater than 0.13 GPa.

13. The sensor device according to claim 6, wherein the epoxy resin material has a flexural modulus of elasticity equal to or greater than 0.13 GPa.

14. The sensor device according to claim 7, wherein the epoxy resin material has a flexural modulus of elasticity equal to or greater than 0.13 GPa.

\* \* \* \* \*